(12) United States Patent  (10) Patent No.: US 7,539,232 B1
Corcoran  (45) Date of Patent: May 26, 2009

(54) COMPACT PHASE LOCKED LASER ARRAY AND RELATED TECHNIQUES

(76) Inventor: Christopher J. Corcoran, 49 Jerome Ave., Newton, MA (US) 02465

( * ) Notice: Subject to any disclaimer, the term of this patent is extended or adjusted under 35 U.S.C. 154(b) by 589 days.

(21) Appl. No.: 11/056,793

(22) Filed: Feb. 11, 2005

Related U.S. Application Data

(63) Continuation-in-part of application No. 10/763,406, filed on Jan. 22, 2004, now abandoned, which is a continuation of application No. 09/968,293, filed on Oct. 1, 2001, now Pat. No. 6,714,581.

(51) Int. Cl.
  *H01S 3/08* (2006.01)
(52) U.S. Cl. .............................. 372/98; 372/92; 372/99; 372/101
(58) Field of Classification Search ............ 372/29.014, 372/92, 98–99, 101
  See application file for complete search history.

(56) References Cited

U.S. PATENT DOCUMENTS

| | | | |
|---|---|---|---|
| 4,246,548 A * | 1/1981 | Rutz .................. | 372/44.01 |
| 4,479,224 A | 10/1984 | Rediker | |
| 4,813,762 A | 3/1989 | Leger et al. | |
| 4,818,062 A | 4/1989 | Scifres et al. | |
| 4,972,427 A | 11/1990 | Streifer et al. | |
| 5,027,359 A | 6/1991 | Leger et al. | |
| 5,081,637 A | 1/1992 | Fan et al. | |
| 5,115,444 A | 5/1992 | Kirkby et al. | |
| 5,139,609 A | 8/1992 | Fields et al. | |
| 5,217,290 A | 6/1993 | Windross | |
| 5,365,541 A | 11/1994 | Bullock | |
| 5,369,659 A | 11/1994 | Furumoto et al. | |
| 5,386,426 A * | 1/1995 | Stephens ............ | 372/20 |
| 5,600,666 A | 2/1997 | Hiiro | |
| 5,608,745 A | 3/1997 | Hall et al. | |
| 5,661,747 A * | 8/1997 | Hiiro ................ | 372/101 |
| 5,745,511 A | 4/1998 | Leger | |
| 5,787,107 A | 7/1998 | Leger et al. | |
| 5,802,092 A | 9/1998 | Endriz | |
| 5,850,299 A * | 12/1998 | Lande et al. ........ | 359/1 |
| 5,854,710 A | 12/1998 | Rao et al. | |
| 5,923,475 A | 7/1999 | Kurtz et al. | |
| 5,970,168 A * | 10/1999 | Montesanto et al. ... | 382/149 |
| 6,021,141 A | 2/2000 | Nam et al. | |
| 6,075,912 A | 6/2000 | Goodman | |

(Continued)

OTHER PUBLICATIONS

Augst et al.; "Wavelength Beam Combining of Ytterbium Fiber Lasers;" 2003 Optical Society of America; Mar. 1, 2003; vol. 28, No. 5; Optics Letters; pp. 331-333.

(Continued)

*Primary Examiner*—Minsun Harvey
*Assistant Examiner*—Phillip Nguyen
(74) *Attorney, Agent, or Firm*—Daly, Crowley, Mofford & Durkee, LLP

(57) ABSTRACT

An electro-optical system includes a plurality of electromagnetic gain media having a corresponding plurality of apertures. The apertures are disposed in a predetermined spatial distribution. The system further includes at least one refracting surface disposed to intercept energy from the plurality of apertures and a reflecting surface to direct portions of the intercepted energy back through the at least one refracting surface and back toward the plurality of apertures. The return energy is distributed about the plurality of apertures.

44 Claims, 16 Drawing Sheets

U.S. PATENT DOCUMENTS

| | | | |
|---|---|---|---|
| 6,212,216 | B1 | 4/2001 | Pillai |
| 6,243,407 | B1 | 6/2001 | Mooradian |
| 6,385,229 | B1 | 5/2002 | Hiiro |
| 6,697,411 | B2 | 2/2004 | Hoose et al. |
| 6,714,581 | B2 | 3/2004 | Corcoran |
| 2002/0154662 | A1* | 10/2002 | Turpin et al. .................. 372/20 |
| 2003/0063631 | A1 | 4/2003 | Corcoran |
| 2004/0170201 | A1 | 9/2004 | Corcoran |
| 2004/0170204 | A1 | 9/2004 | Corcoran |

OTHER PUBLICATIONS

Corcoran et al.; "Operation of Five Individual Diode Lasers as a Coherent Ensemble by Fiber Coupling into an External Cavity;" 1991 American Institute of Physics; Appl. Phys. Lett. 59(7), Aug. 12, 1991; pp. 759-761.

Feng et al.; "Laterally Periodic Resonator for Large-Area Gain Lasers;" Optics Express; Mar. 24, 2003, vol. 11, No. 6; pp. 632-638.

Ishaaya et al. "Improving the Output Beam Quality of Multimode Laser Resonators;" Optics Express; Apr. 4, 2005, vol. 13, No. 7; pp. 2722-2730.

Katz et al; Diffraction Coupled Phase-Locked Semiconductor Laser Array; 1983 American Institute of Physics; Appl. Phys. Lett 42(7) Apr. 1, 1983; pp. 554-556.

Minden et al.; "Coherent Combining of Fiber Amplifiers and Lasers;" 2003 HRL Laboratories; PowerPoint Presentation; pp. 1-17.

Morel et al.; Coherent Coupling of an Array of Nd3+-Doped Single-Mode Fiber Lasers by Use of an Intracavity Phase Grating; 1993 Optical Society of America; Optics Letters, vol. 18, No. 18; Sep. 15, 1993; pp. 1520-1522.

Peng et al; "Phase Locking of Fibre Lasers by Self-Imaging Resonator;" Electronics Letters Feb. 17, 2005; vol. 41, No. 4; two pages.

Pillai et al; Paraxial-Misalignment Insensitive External-Cavity Semiconductor-Laser Array Emitting Near-Diffraction Limited Single-Lobe Beam; IEEE Journal of Quantum Electronics; vol. 32, No. 6; Jun. 1996; pp. 996-1008.

Peterson et al.; "Extraction Characteristics of a CW Double-Hexagonal Talbot Cavity with Stochastic Propagation Phase;" Opt. Express 8 (2001); pp. 670-682.

Rafferty et al; "Coherent Coupling of Two-Dimensional Arrays of Defect Cavities in Photonic Crystal Vertical Cavity Survace-Emitting Lasers;;" 2005 American Institute of Physics; Applied Physics Letters 86 (2005); pp. 201104-1 to 201104-3.

Tondusson et al; "Coherent Cominbation of Four Laser Beans in a Multi-Axis Fourier Cavity Using a Diffractive Optical Element;" Journal of Optics A: Pure and Applied Optics; J. Opt. 3 (2001); pp. 521-526.

Wolff et al; "Fourier-Optical Selection of Higher Order Transverse Modes in Broad Area Lasers;" Optics Express; vol. 5, No. 3; Aug. 2, 1999; pp. 32-37.

Zhou et al.; "Phase Locking of a Two-Dimensional Laser Array by Controlling the Far-Field Pattern;" 2004 American Institute of Physics; Applied Physics Letters; vol. 84, No. 16; Apr. 19, 2004; pp. 3025-3027.

"Module 3-11 Seimiconductor Lasers;" The Center for Occupational Research and Development FIPSE-Supported Curriculum Morphing Project; Course 3. module 11. Semiconductor Lasers; from the website: http://cord.org.cm/leot/course03_mod11/mod03_11.htm; pp. 1-22.

"Module 6-9 Gratings;" The Center for Occupational Research and Development; 1988; ISBN 1-55502-084-0; from the website: http://cord.org/cm/leot/course06_mod09/mod06_09.htm; pp. 1-21.

"Phase-Locked Array of Antiguided Lasers with Monolithic Spatial Filter", Electronics Letters, vol. 25, No. 5, Mar. 2, 1989, pp. 365-367.

Botez, D. et al. "Diode Laser Arrays", Cambridge Studies in Modern Optics, pp. 1-3.

Anderson et al.; "High-Spectral-Purity CW and Pulse Output from an Ensemble of Discrete Diode Lasers;" 1987 American Institute of Physics; Appl. Phys. Lett 50(1); Jan. 5, 1987; pp. 1-3.

Chann et al.; "Frequency-Narrowed External-Cavity Diode-Laser-Array Bar;" 2000 Optical Society of America; Optics Letters/vol. 25, No. 18; Sep. 15, 2000; pp. 1352-1354.

Liu et al; "Phase Locking in a Fiber Laser Array with Varying Path Lengths;" 2004 American Institute of Physics; Applied Physics Letter;vol. 85, No. 21; Nov. 22, 2004; pp. 4837-4839.

Menard et al; "Highly Efficient Phase Locking and Extracavity Coherent Combination of Two Diode-Pumped Nd: YAG Laser Beams;" 1996 Optical Society of America; Optics Letters/vol. 21, No. 24; Dec. 15, 1996; 3 sheets.

Nelson et al.: "Frequency-narrowed external-cavity diode-laser-array bar;" Optics Letters; vol. 25, No. 18; Sep. 15, 2000; pp. 1352-1354.

Caola; "Self-Fourier Functions;" Letter to the Editor; J.Phys. A: Math. Gen. 24 (1991) printed in UK; 1991 IOP Publishing Ltd.; 0305-4470/91/191143+02; pp. L1143-L1144.

Cincotti et al.; "Generalized Self-Fourier Functions;" Letter to the Editor, J.Phys. A: Math. Gen. 25 (1992) printed in UK; 1992 IOP Publishing Ltd.; 0305-4470/92/201191+04; pp. L1191-L1194.

Coffey; "Self-Reciprocal Fourier Functions;" J.Opt.Soc.Am. A, vol. 11, No. 9/Sep. 1994; pp. 2453-2455.

Corcoran; "Compact Phase-Locked Fiber-Laser Array;" Phase I Small Business Innovation Research (SBIR) Program; Proposal #B011-0269, Topic #BMDO01-001; pp. 3-24 plus SBIR proposal.

Corcoran; "Phase Locked Fiber Laser Array in Compact External Cavity;" Phase I Small Business Innovation Research (SBIR) Program; Proposal #F001-2965, Topic #AF00-002; pp. 3-25 plus SBIR proposal.

D'Amato, F.X. et al. "Coherent operation of an array diode lasers using a spatial filter in a Talbot cavity", Appl. Phys. Lett. 55 (9), Aug. 28, 1989, pp. 816-818.

Fader, W.J. et al. "Normal modes of N coupled lasers", Optics Letters, vol. 10, No. 8, Aug. 1985, pp. 381-383.

Leger, James R. et al. "Coherent addition of AIGaAs lasers using microlenses and diffractive coupling", Appl. Phys. Lett. 52 (21), May 23, 1988, pp. 1771-1773.

Lipson; Self-Fourier Objects and Other Self-Transform Objects: Comment; 1993 Optical Society of America/vol. 10, No. 9/Sep. 1993; 0740-3232/93/092088-02; pp. 2088-2089.

Lohmann et al.; "Self-Fourier Objects and Other Self-Transform Objects;" 1992 Optical Society of America; vol. 9, No. 11/Nov. 1992/J.Opt.Soc.Am.A; 0740/3232/92/112009-04; pp. 209-2012.

Mehuys, D. et al. "Supermode control in diffraction—coupled semiconductor laser arrays", Appl. Phys. Lett. 53 (13) Sep. 26, 1988, pp. 1165-1167.

Mehuys, David et al. "Modal analysis of linear Talbot—cavity semiconductor lasers", Optics Letters, Jun. 1, 1991, vol. 16, No. 11 pp. 823-825.

Wrage, M. et al. "Combined phase locking and beam shaping of a multicore fiber laser by structured mirrors", Optics Letters, vol. 26, No. 13, Jul. 1, 2001, pp. 980-982.

File downloaded from PAIR for U.S. Appl. No. 6,714,581, issued on Mar. 30, 2004, through Feb. 26, 2009; 77 pages.

Filed downloaded from PAIR for U.S. Appl. No. 10/763,406, filed on Jan. 22, 2001, through Feb. 26, 2009; 73 pages.

* cited by examiner

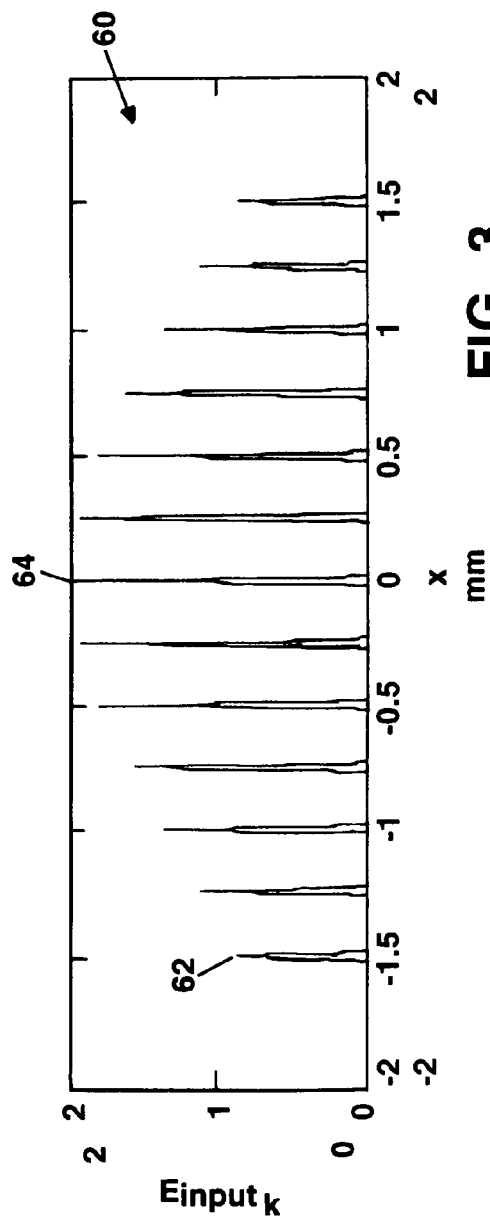
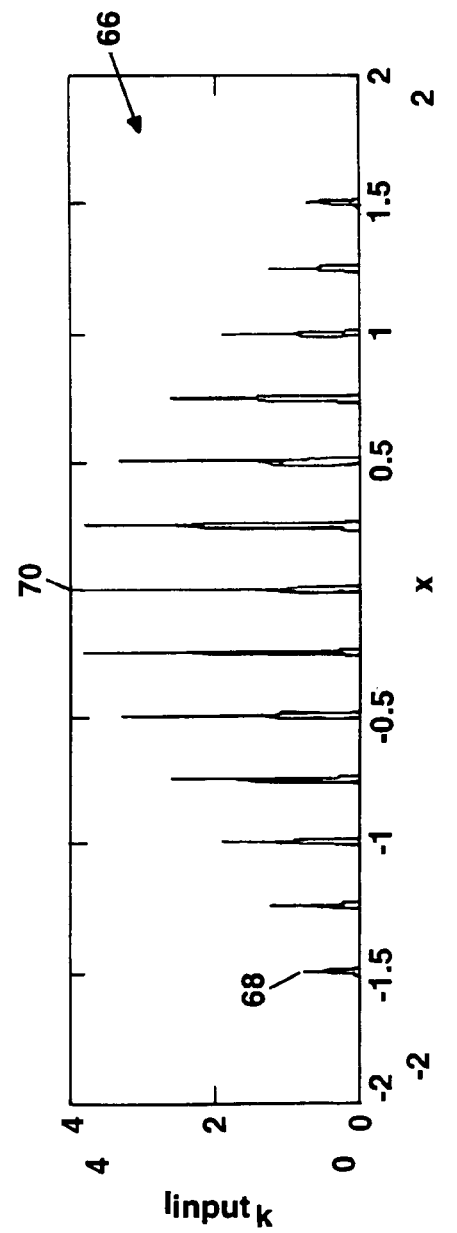

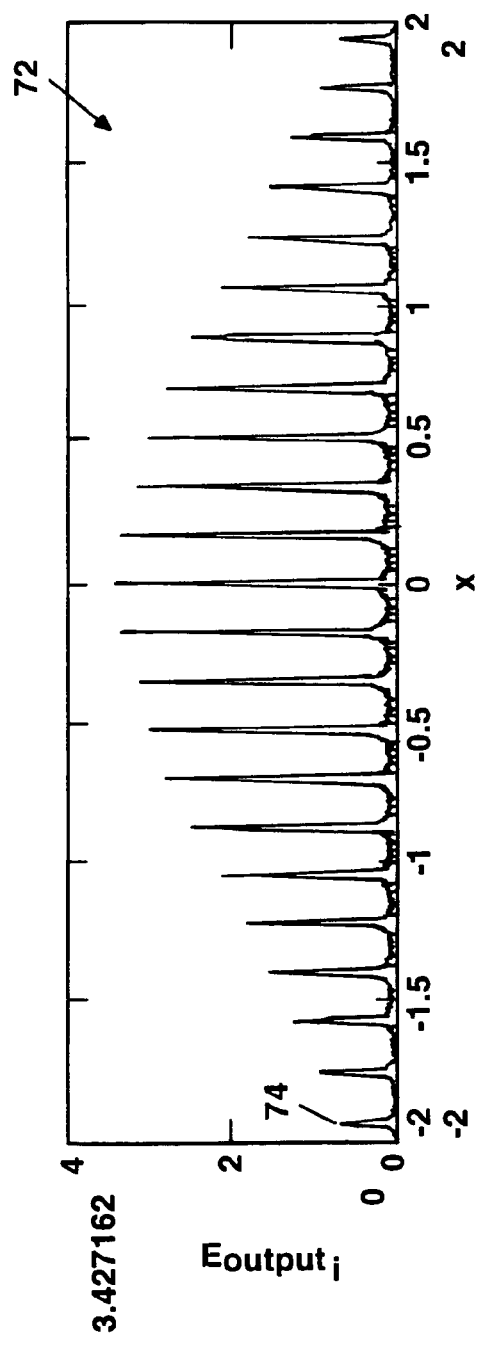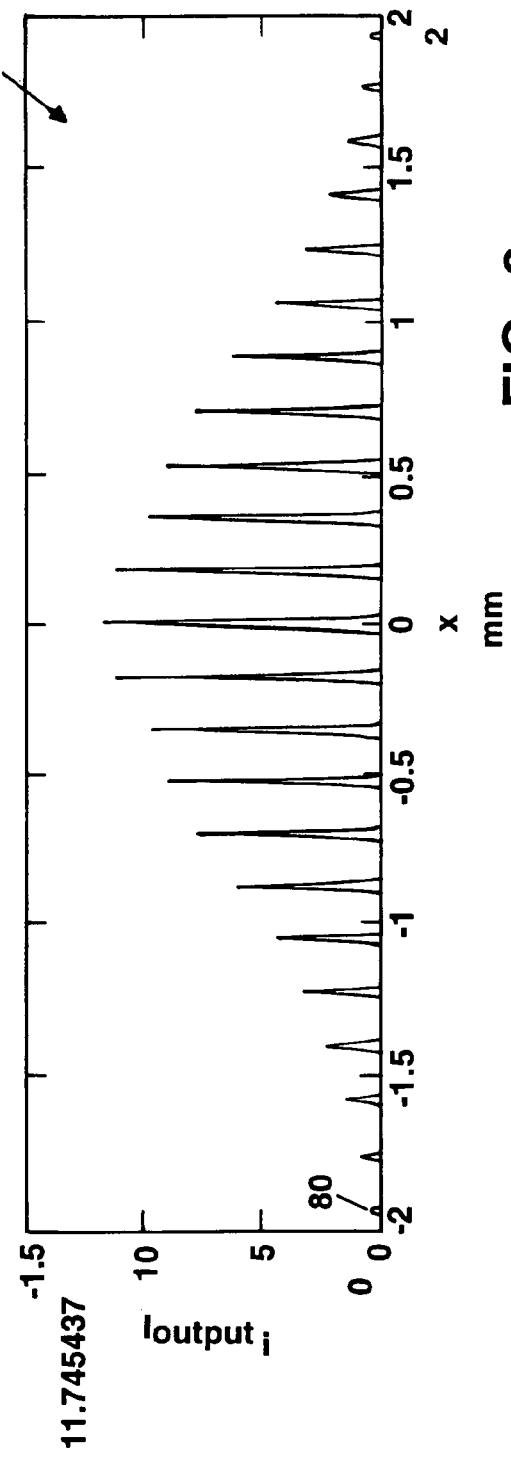

COMPACT PHASE LOCKED LASER ARRAY AND RELATED TECHNIQUES

CROSS REFERENCE TO RELATED APPLICATIONS

This application is a Continuation-in-Part application of and claims the benefit under 35 U.S.C. §120 of U.S. application Ser. No. 10/763,406 filed on Jan. 22, 2004, now abandoned which application is a Continuation application of and claims the benefit under 35 U.S.C. § 120 of U.S. application Ser. No. 09/968,293 filed on Oct. 1, 2001 (U.S. Pat. No. 6,714,581, issued Mar. 30, 2004), which applications and patent are incorporated herein by reference in their entirety.

STATEMENT REGARDING FEDERALLY SPONSORED RESEARCH

This invention was made with government support under Contract No. N00178-03-C-3005 awarded by the Department of the Navy. The government has certain rights in the invention.

FIELD OF THE INVENTION

This invention relates generally to electro-optical systems and more particularly to electro-optical systems having a plurality of gain media to produce a composite, coherent beam of energy.

BACKGROUND OF THE INVENTION

As is known in the art, electro-optical systems have a wide range of applications. Many of these applications include the use of a plurality of gain media to produce a composite, coherent beam of energy. Some of these applications are medical, and defense applications where it is often desirable to utilize high power laser electro-optical systems. The development of high power laser systems such as chemical lasers and gas lasers, has achieved some significant levels of laser power. These applications include metal cutting and welding, medical procedures such as Transmyocardial Revascularization (TMR) to treat coronary artery disease, direct printing and engraving, and defense weapons. However, many laser systems currently used in these applications remain complex, cumbersome and have drawbacks such as low efficiency, and the requirement for non-renewable energy sources. These laser systems are not readily scalable to higher power ranges.

If high power laser systems are to become more effective and widespread, new laser technologies are required that provide more compact, efficient, stable and higher powered than systems currently available. For example, diode-pumped fiber lasers have demonstrated efficient electrical-to-optical power conversion into a diffraction-limited laser beam. Single mode outputs of over 100 W have been reported from a fiber laser pumped by semiconductor diode lasers. The conversion of the multimode output of the diode laser pump to the single mode fiber output can be achieved with a quantum efficiency of approximately 85%, resulting in an overall efficiency of the order of 30%. These individual lasers can be constructed to be rugged and compact. Their electric energy source is widely available, easily renewed, and can be generated by many different techniques in any environment including space or under water. However, intrinsic characteristics such as non-linear effects inside the small single-mode core of the fiber ultimately limit the output power generated individually by such devices. The power output of an individual diode-pumped fiber laser will ultimately be limited by the damage threshold of the fiber core and cladding materials, as well as facet coatings.

In order to circumvent these limitations and generate scalable high output power levels in a diffraction-limited beam, laser systems can coherently combine the output of several fiber lasers. As is known in the art, the technique of phase locking allows combining several optical beams into a single beam. This technique combines the output power of each individual optical beam while preserving the spatial and spectral coherence of each individual beam. This approach enables the scalability of laser systems that can produce high power coherent diffraction-limited beams.

Coherent combination of multiple beams can be achieved by several different techniques. These techniques require that all the beams have the same wavelength, the same polarization, and be phase locked in the proper phase state in the plane of combination. In a laser system, this can be accomplished in several different ways. For example, one can use a single beam to "seed" or injection-lock all the laser beams to be combined, thus ensuring that they be all at the same wavelength and polarization, and that a stable coherent phase regime exists for each source. One then needs to control or adjust the phases of all the laser beams to achieve coherent combination. Laser beams can also be combined using the Talbot effect as in known in the art.

Another technique is to optically couple all the laser beams together in parallel in a common cavity, thus ensuring that they are all at the same frequency and in a single coherent phase state.

External-cavity coupling of laser diodes has been successfully demonstrated to produce output beams both spectrally coherent as well as spatially coherent.

Many conventional external cavity laser designs utilize a "4-F" optical configuration. The "4-F" refers to the four focal length size of the external cavity. This technique uses two lenses inside the external cavity to Fourier transform the optical input pattern (i.e. electric field amplitude) a total of 4 times in a single round trip, resulting in an identity operation as described in "Introduction to Fourier Optics", by Joseph W. Goodman published by McGraw Hill Book Company, 1968. A spatial filter is placed at the Fourier plane and only allows light intensity (magnitude squared of the Fourier Transform of the input electric field pattern), which is coherent between the multiple gain elements to pass through the filter. The radiation beam must pass through the spatial filter twice before reentering the gain media. The double pass through the spatial filter reduces the overall efficiency of the laser array. The 4-F designed laser arrays require polarization adjusters, phase adjusters, and the spatial filter in the path of the radiation. Some of the problems associated with these designs include their large size, complexity, the need for numerous adjustments and stability of the laser output.

Thus, in high power laser applications, there is a need for a system to efficiently combine multiple laser sources using a compact external cavity design to provide a stable phased locked output without requiring numerous adjustments.

SUMMARY OF THE INVENTION

In accordance with the present invention, an electro-optical system is provided having one or more electromagnetic gain media adapted to provide energy and a plurality of apertures coupled to the one or more electromagnetic gain media. The plurality of apertures has a predetermined spatial distribution and is adapted to emit the energy. The system further includes an optical system adapted to provide a Fourier pattern of the energy emitted from the plurality of apertures and adapted to overlay the Fourier pattern back onto selected ones of the plurality of apertures.

In one particular embodiment, the optical system includes at least one refracting surface disposed to intercept the energy emitted from the plurality of apertures and a reflecting surface adapted to direct a portion of the intercepted energy back toward the plurality of apertures. Each of the at least one refracting surface can have a shape selected such that the directed energy is distributed about the plurality of apertures in a predetermined pattern.

In accordance with a further aspect of the present invention, a method of producing a phase coherent beam includes providing one or more electromagnetic gain media adapted to provide energy and providing a plurality of apertures coupled to the one or more electronic gain media, wherein the plurality of apertures has a predetermined spatial distribution, and wherein the plurality of apertures are for emitting the energy. The method further includes emitting the energy from the plurality of apertures, generating a Fourier pattern of the energy emitted from the plurality of apertures, and overlaying overlaying the Fourier pattern back onto selected ones of the plurality of apertures.

In one particular embodiment, the generating the Fourier pattern and the overlaying the Fourier pattern are provided by an optical system. The optical system includes at least one refracting surface disposed to intercept the energy and a reflecting surface disposed to reflect at least a portion of the intercepted energy back toward the plurality of apertures.

BRIEF DESCRIPTION OF THE DRAWINGS

The foregoing features of this invention, as well as the invention itself, may be more fully understood from the following description of the drawings in which:

FIG. 3 is an exemplary radiation pattern showing the spatial distribution of input electric field amplitude (also referred to herein as amplitude or field) of the system of FIG. 1;

FIG. 4 is an exemplary radiation pattern showing the spatial distribution of input optical intensity of the system of FIG. 1A (as is known in the art, the optical intensity is proportional to the magnitude of the electric field amplitude squared);

FIG. 5 is an exemplary radiation pattern showing the spatial distribution of output electric field amplitude of the system of FIG. 1A;

FIG. 6 is an exemplary radiation pattern showing the spatial distribution of output optical intensity of FIG. 1A;

DETAILED DESCRIPTION OF THE INVENTION

Before describing the phase locked laser array of the present invention some introductory concepts and terminology are described. It will be understood that a Fourier lens performs a spatial Fourier transform upon a spatial input energy function, providing a spatial output energy function.

As used herein, the term "self Fourier function" (SFF) is used to describe a spatial function (an input function), which, when operated on by a Fourier lens, provides a spatial function (an output function) that is substantially the same as the input function. That is, the function is substantially equal to its own spatial Fourier transform (optical transform). The input function can be a laser spatial amplitude function having an amplitude that varies with position along an axis.

As used herein, the term "partially reflecting surface" is used to describe both a partially reflecting mirror and a diffraction surface. It will be understood that light hitting a diffraction surface can be split by interaction with the diffraction surface into two or more directions.

As used herein, the term "reflecting surface" is used to describe both a partially reflecting surface and a fully reflecting surface.

As used herein, the term "electromagnetic gain media" is used to describe any medium that can amplify electromagnetic energy, including but not limited to, optical gain media, lasers, frequency converters, and doubling crystals.

Figure 1A:
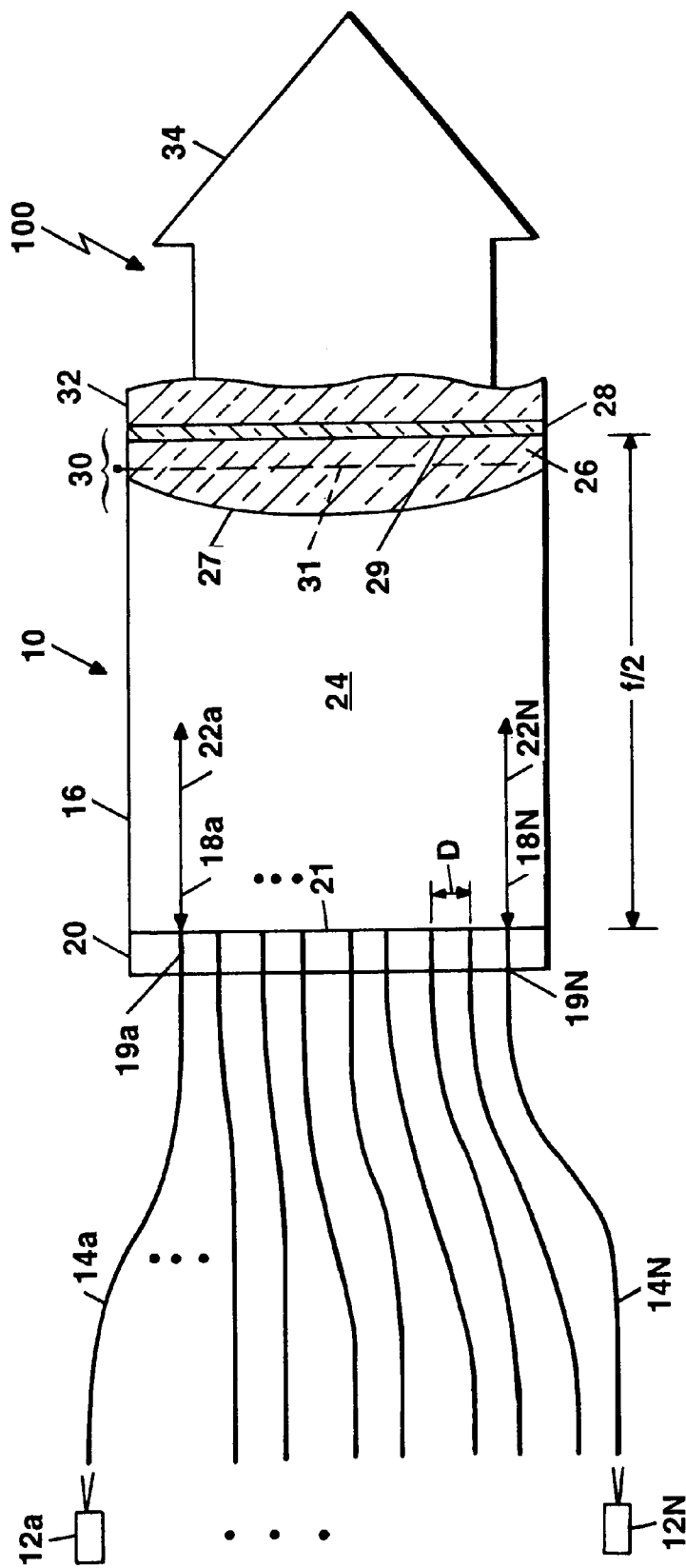
FIG. 1A is a schematic diagram of a compact phase locked laser array electro-optical system according to the invention.

Referring now to FIG. 1A, an electro-optical system, here a laser array system 100 is shown to include an assembly 10 having a first end 20, a common element 30, and a housing 16. The housing 16 provides an external cavity 24. An absorbing surface 21 is disposed on the first end 20. The common element 30 includes a lens 26 and a reflector 28. The lens 26 has a refracting surface 27 and a principle plane 31, and the reflector 28 has a partially reflecting surface 29. The laser array system 100 further includes a plurality of electromagnetic gain media 14a-14N (generally referred to as gain media 14), here for example, fiber lasers. The gain media 14a-14N are disposed on a corresponding plurality of slots 19a-19N arranged on the first end 20 of the assembly 10.

A distance to the lens 26 can be described by a distance to the principal plane 31 of the lens 26.

Each one of the gain media 14a-14N is electromagnetically coupled to a corresponding one of a plurality of electromagnetic gain media energy sources 12a-12N, here for example, pump diodes. Each one of the gain media 14a-14N includes a corresponding one of a plurality of ports or apertures 18a-18N (generally referred to as apertures 18). More particularly, the gain media 14 amplify electromagnetic energy fed thereto via the energy sources 12 and the amplified energy is then electromagnetically coupled to the external cavity 24 via apertures 18 to thereby provide a plurality of radiation beams 22a-22N within the external cavity 24. The radiation beams 22a-22N are emitted from apertures 18a-18N as separate beams, the radiation beams 22a-22N are combined in parallel by the refracting surface 27 and the partially reflecting surface 29 into a single composite output beam 34. The output beam 34 is referred to as a single beam because the array emits the combined radiation as a coherent bundle.

In the embodiment shown in FIG. 1A, the output beam 34 is a coherent laser beam also referred to as a phase locked laser beam. It should be noted that the assembly 10 emits energy coherently in a phase locked manner and, in some embodiments, there is negligible radiation incident upon the absorbing surface 21. Each of the apertures 18a-18N of the gain media 14 is spaced apart from a neighboring aperture 18 by a predetermined distance D. That is, the apertures 18 and the corresponding spacings disposed therebetween, which are coated with energy absorbing material, are disposed in a predetermined spatial distribution. As will be described in more detail hereinafter, the apertures 18 and the corresponding spacings disposed therebetween provide a spatial filter. The common element 30 is spaced apart from the plurality of apertures 18 by approximately one half a focal length of the common element 30. The assembly 10 can also be referred to as a half-f cavity because of the half-f spacing between the common element 30 and the plurality of apertures 18. The laser array system 100 further includes beam shaping optics 32 adjacent to the assembly 10 to shape the output beam 34.

In operation, the pump diode energy sources 12 pump the gain media 14 at the nominal operating wavelength of the diodes, here for example a wavelength of approximately 0.83 μm. As is known in the art, the energy from the pump diode energy sources 12 is absorbed by the fibers, and is re-emitted in a coherent manner, here for example at a wavelength of approximately 1.06 μm. It will be appreciated by those of ordinary skill in the art, that although the laser array system 100 is shown operating fiber lasers as the gain media 14, the assembly 10 can be used to couple together many types or number of lasers including but not limited to diode pumped fiber lasers, fiber coupled diode lasers, gas lasers, diode pumped solid state lasers, and monolithic diode arrays. The energy of the gain media 14 is electromagnetically coupled via apertures 18 into the assembly 10 as beams 22 and directed to the common element 30. The partially reflecting surface 29 of the common element 30 intercepts energy (i.e., beams 22) from the plurality of electromagnetic gain media 14 and directs portions of the energy back to the plurality of gain media 14 with the directed energy being distributed about the plurality of apertures 18. The refracting surface 27 of the common element 30 provides a Fourier Transform of the energy from the plurality of gain media 14. The transform couples together the outputs of the gain media 14 to provide an interference pattern at the apertures 18. The energy of the interference pattern is fed back into the apertures of the gain media (as described in more detail in conjunction with FIGS. 2-6).

The plurality of apertures 18 has a corresponding Fourier plane (also referred to as a spatial frequency plane) and the apertures 18 are disposed in this Fourier or spatial frequency plane. It should be noted, that a stable interference pattern is formed only when the radiation emitted from apertures 18 is spatially coherent across the apertures 18. To put it another way, there is only substantial feedback to the array when the radiation from the apertures 18 is phase locked.

The reflector 28 is a partially reflecting end mirror, here for example, 15 percent reflective) made of coated glass, for instance, which could be joined to the lens 26 to form the common element 30 which directs energy back to the apertures and gain media 14. It should be noted that the lens 26 and reflector 28 can be replaced by a single element or a combination of optical elements such as a diffraction grating or a curved mirror. The lens 26 is spaced apart from the apertures 18 of gain media 14 by a distance of approximately f/2. The partially reflecting surface 29 enables the common element 30 to direct the energy back to the plurality of apertures 18.

The radiation beams 22 are spatially transformed by the lens 26 and partially reflected by the reflector 28 (as described below in conjunction with FIGS. 2-6). The apertures 18 spaced apart by distance D and the corresponding spacings disposed therebetween provide a spatial filter in the external cavity 24. The radiation feedback of the reflected energy through the spatial filter directed into the apertures 18 provides phase coherency in the output beam 34. The beam shaping optics 32 transforms the radiation leaving the external cavity 24, for example, into the composite plane wave output beam 34 having phase coherency. That is, the plurality of beams 22a-22N combine within the external cavity 24 to exit the assembly 10 as the output beam 34. The components of the output beam 34 (i.e., beams 22a-22N) are combined by the assembly 10, including the spatial filter to all be coherent, one with the other, when they leave the external cavity 24 as the output beam 34.

In one embodiment, the absorbing surface 21 of the first end 20 inside the assembly 10 is painted black or coated with an energy absorbing material. The absorbing material, here for example, black paint is selected to absorb the energy which is directed to corresponding spacings disposed between apertures 18. The spacing D is chosen to minimize the energy absorbed by the absorbing surface 21, to maximize the energy fed back into apertures 18, and to cause substantially all of the light having the desired composite, coherent nominal wavelength to be combined in parallel to produce the output beam 34 output of the assembly 10 in a manner to be described in more detail hereinafter.

In one embodiment, the housing 16 of the assembly 10 is preferably constructed from material with iron alloys, known in the art, that exhibit extremely low thermal expansion coefficients and provide excellent thermal stability, such as Invar or Super Invar (which has a low thermal expansion coefficient of $3.6*10^{-7}$ $K^{-1}$) in order to minimize misalignment due to thermal variations. The housing 16 optionally includes additional supports (not shown) for improving thermal stability, mounts (not shown) for the gain media 14 and brackets (not shown) for mounting the common element 30. Alternatively, the housing 16 can be constructed as a monolithic structure to provide a high level of system stability.

Figure 1B:
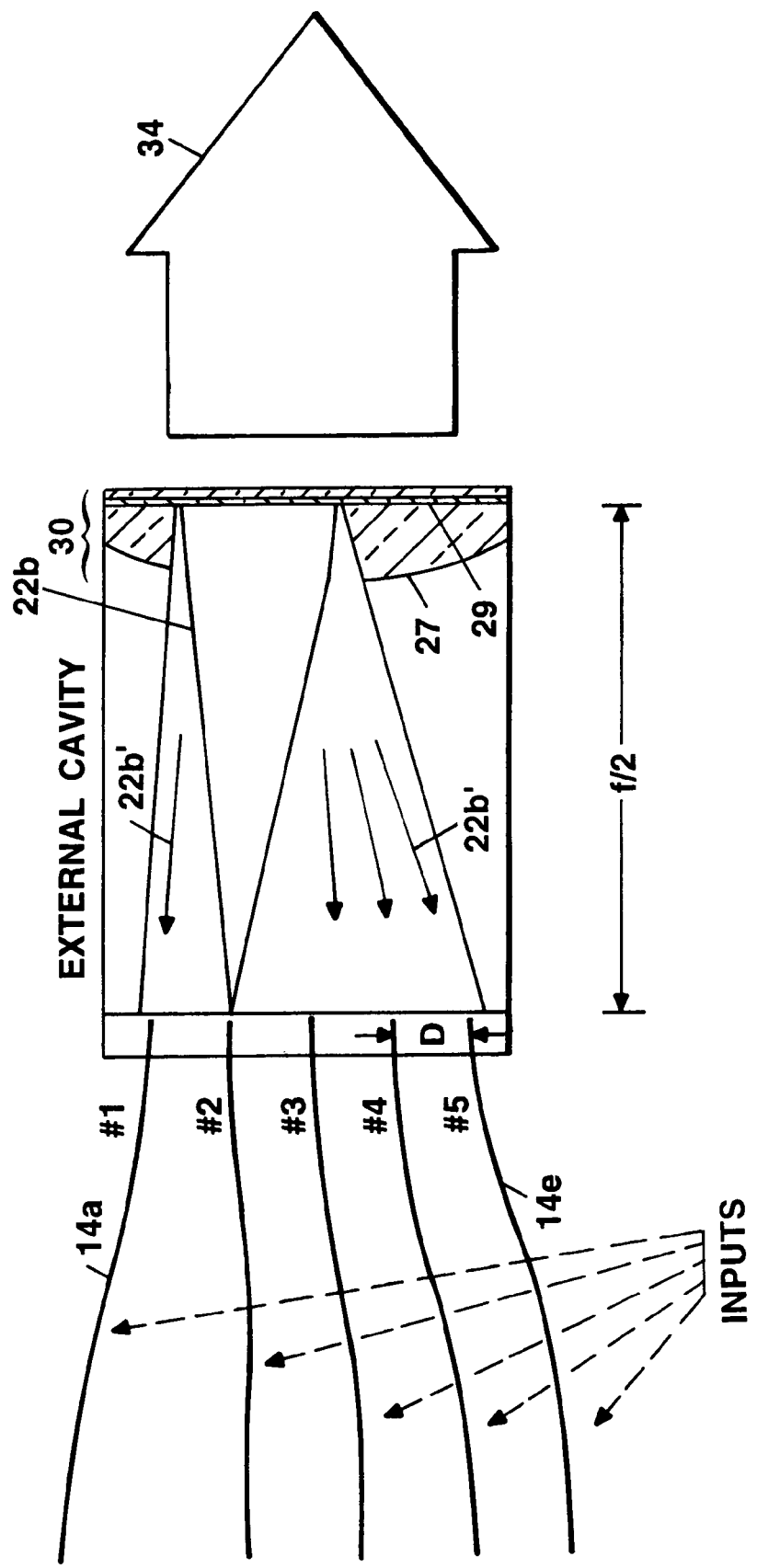
FIG. 1B is a schematic diagram showing the parallel coupling of the radiation from one aperture to the plurality of apertures according to the invention.

Now referring to FIG. 1B, the refracting surface 27, here, provided by lens 26 intercepts the energy from the plurality of apertures 18. For example, as shown in FIG. 1A, energy 22b from aperture 18*b* is intercepted by the refracting surface 27 of the common element 30 and portions of the energy in reflected beams 22*b*' are directed substantially back to the plurality of apertures 18 by the partially reflecting surface 29 and distributed over all of the apertures 18*a*-18E in the external cavity 24. The process of directing energy from each aperture 18*a*-18*e* into all of the apertures 18, as illustrated in FIG. 1B, is known in the art as parallel coupling.

Series coupling, as used in many other optical systems, differs from parallel coupling in that energy from an aperture is coupled substantially only to a nearest neighbor in a series coupled optical system. Parallel coupling provides an output beam 34 having a higher degree of coherency compared to series coupling as the number of apertures 18 is increased for a given size cavity.

Figure 2:
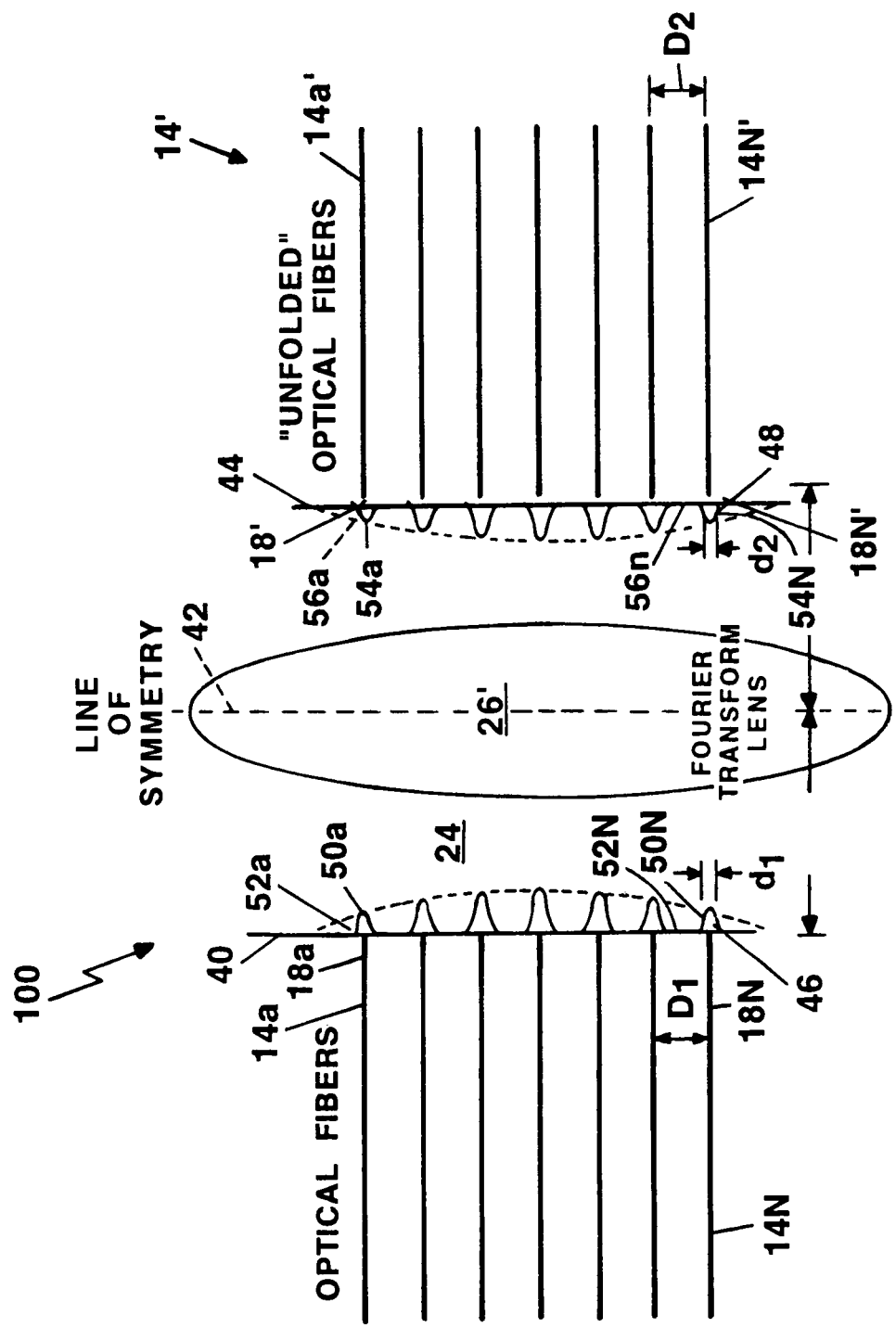
FIG. 2 is a schematic diagram useful in understanding the operation of the system of FIG. 1A, such FIG. 2 showing the unfolded optical path of the system of FIG. 1A.

Now referring to FIG. 2, an "unfolded" geometry, which is not a physical embodiment but is used to help understand the combining operation of the assembly 10, includes an equivalent lens 26'. The lens 26' is symmetrical about a line or axis of symmetry 42. Unfolded gain media 14' including apertures 18' are shown physically separate from gain media 14 for illustrative purposes. Like reference numbers indicate like elements as shown in FIG. 1A. An electric field pattern 46 is produced at an input plane 40. The "doubled" lens 26' (with focal length F) provides a Fourier transformation of the electric field pattern at the input plane 40 to produce an output electric field interference pattern 48 at an output plane 44. An output electric field pattern 48 is an interference pattern, which includes regions of constructive interference 54*a*-54N and regions of destructive interference 56*a*-56N. The apertures 18 are arranged so that the energy in the regions of constructive interference 54 are fed back into the gain media at the apertures 18 providing output energy having a coherent phase relation with a portion of the energy in the gain media 14 and the external cavity 24 of the electro-optical system 100 without requiring a dedicated spatial filter element.

Through the action of the lens 26' in the external cavity 24, the Fourier transform of the electric field pattern 46 at the input plane 40 is the output electric field pattern 48 at the output plane 44. The output electric field pattern 48 is reflected back onto the input plane 40. This transformation provides sufficient coupling back into the gain media 14 of the radiation within the external cavity 24 in order to achieve laser operation. The optical radiation will only couple back into the gain media 14 if the laser elements are coherently phase locked and form the appropriate interference pattern at the input plane of the external cavity 24. This is achieved by arranging the gain media 14 (or apertures 18) in a very specific arrangement, to ensure that the Fourier transform of the gain media input pattern into the assembly 10 is a close match to the gain media input pattern 46 itself.

The spacing of apertures 18 is determined by the Fourier transform of a comb function (spacing $D_1$) which provides a comb output function with spacing $D_2$, Where:

$$D_2 = F^* \lambda / D_1;$$

F is the focal length of the doubled lens to account for the round trip passage; and λ is operating wavelength.

Comparing FIG. 1A and FIG. 2, it can be seen that when the lens 26' is doubled as shown in FIG. 2, the focal length (F) is one half the focal length (f) of the lens as shown in FIG. 1A. That is, F=f/2. This accounts for the double passage (round trip) through the lens.

In order to achieve the condition that the radiation fold back on itself and reproduce the optical input pattern, the aperture 18 spacing D (FIG. 1A) is set at the input to the cavity to be:

$$D = \sqrt{\frac{f}{2} \cdot \lambda}$$

or equivalently $D = \sqrt{F \cdot \lambda}$.

where f is the focal length of lens 26 (FIG. 1A) and λ is the nominal wavelength of the output beam 34 (FIG. 1A). It can be seen that this choice of spacing $D_1$ will result in the condition $D_1 = D_2$. For example, a focal length of f=8.0 cm for lens 26 (F=4.0 cm), and an operating wavelength of approximately 1.1 μm for output beam 34, the spacing D of the apertures 18, corresponding to a center-to-center fiber is spacing of approximately 209.8 μm. Note that the focal length F is the appropriate focal length for light making a round trip through the lens 26. The non-reflective spacings D between the apertures 18 themselves perform the role of a spatial filter. Although the laser array system 100 as shown in FIGS. 1A and 2 depicts a one dimensional device, it now will be appreciated by those of ordinary skill in the art that the Fourier transforming characteristics discussed are all readily extended to two dimensions and that the gain media 14 could be a two dimensional gain media array. Optionally, a lenslet array (not shown) can be incorporated at the input plane into the cavity to individually collimate the individual radiation beams 22*a*-22N (FIG. 1A). Reducing the overall length of the cavity to approximately f/2, simplifies the laser array system 100, and also increases the stability of the laser operation. In this example, the external cavity 24 would be approximately 4.0 cm long, while a convention "4F" configuration the external cavity 24 would be approximately 16.0 cm long.

Referring again to FIG. 1A, using the predetermined spacing D of the apertures 18 of the gain media 14 themselves to perform the role of the spatial filter, enables the Fourier Transform lens 26 to perform a mapping of the output from an array of gain media 14 back into to a very specific output pattern which can efficiently couple back into the gain media 14.

Since $D_2 = F \cdot \lambda / D_1 = (f/2) \cdot \lambda / D_1$ (as shown in FIG. 2) setting the aperture 18 spacing at the input to:

$$D_1 = \sqrt{\frac{f}{2} \cdot \lambda}$$

will result in $D_2 = D_1 = D$. If the reflector mirror is placed at the line of symmetry 42 (FIG. 2) the output image will map back onto, and couple into the input array of gain media with high efficiency. For example, a spacing between the apertures 18 of approximately 209.8 μm (distance D) would be appropriate for λ approximately equal to 1.1 μm, a focal length f=8 cm, and thirteen gain media elements. It should be appreciated by one skilled in the art that there are many configurations where it would be advantageous to utilize a cavity where $D_1$ is not equal to $D_2$.

The assembly 10 is designed to operate without the need for collimating lenses to couple the input fibers or the output fibers to the assembly. This simplifies the cavity design. If required, however, collimating lenses (not shown) can be incorporated into the design to change the fill factor of the array. This might be required to change the number of elements that are used in the array.

Now referring to FIGS. 3 and 4, a one dimensional input pattern includes an electric field input pattern ($E_{input}$) 60 and corresponding electric field input intensity pattern ($I_{input}$) 66. Electric field input pattern ($E_{input}$) 60 is composed of three simple patterns:

1) B(x) Comb function, spaces the multiple fiber inputs (with spacing, D (see, for example, FIG. 1A), in this case, approximately equal to 250 µm).
2) A(x) Gaussian radiation output function, describes the field pattern at the emitting surface of each gain media aperture. In this case, the Gaussian width, a, (see, for example, FIG. 15) of the functions entering the cavity is approximately equal to 11 µm (diameter=2*11 µm=22 µm).
3) C(x) Envelope function, describes the relative weightings of the fiber inputs (this includes the aperture function which limits the number of fiber inputs). This function is also approximately Gaussian with Gaussian width, c (see, for example, FIG. 15)

These functions are combined in the following manner to obtain the electric field input pattern $E_{Field}(x)$ 66;

$$E_{Field}(x) = C(x) \cdot \{A(x)\hat{x}B(x)\}$$

where $\hat{x}$ represents a convolution operator.

As used herein, the term Gaussian width, a, (for example) refers to the distance, a, at which the amplitude of the field is reduced to a factor of exp(−1) or approximately 36.8% compared to the peak value. (see, for example, FIG. 15)

The electric field input pattern ($E_{input}$) 60 of a fiber array is a function of x ($x_k$ measured in mm) evaluated at y=0 where k is a running index used in the software which generated this figure.

The pattern 60 in the example of FIG. 3 corresponds to a 13 element array of single mode fiber lasers with core diameters of approximately 22 µm and a center-to-center spacing of $D_1$ approximately equal to 250 µm. In one embodiment $D_1$ is set equal to $D_2$. In other embodiments, $D_1$ is not equal to $D_2$.

As shown in FIG. 4, the input optical intensity pattern ($I_{input}$) 66 looks similar to the electric field input pattern 60 (FIG. 3) the same spacing in the comb function, but with narrower peaks and with a narrower envelope function. This input optical intensity pattern 66 is representative of the output intensity pattern of a linear array of optical fibers measured along the centerline of the fibers. The important point to be noted about the electric field input pattern 60 and the input optical intensity pattern 66 is that the Fourier transform of this function can be tailored to couple into an array of gain media 14 with high efficiency.

Now referring to FIGS. 5 and 6, a calculated electric field output amplitude 72 ($E_{output}$) and a corresponding output optical intensity 78 ($I_{output}$) represent the Fourier transform of the input electric field function 64 (FIG. 3). The results of this transform with a laser wavelength of approximately 1.1 µm and a focal length (f) of 8.0 cm (F=4.0 cm) are shown in FIGS. 5 and 6. The output amplitude waveform 72 includes a series of spikes 74 (FIG. 5) with spacings of approximately 0.176 mm (176 µm). The output optical intensity 78 includes a series of spikes 80 (FIG. 6) with spacings of approximately 176 µm. The output optical intensity spikes 80 and output amplitude spikes 74 correspond to the regions of constructive interference 54 (FIG. 2). The apertures 18 are arranged so that the spikes 74 (or equivalently spikes 78) are aligned with the apertures 18.

An important aspect of the output optical intensity ($I_{ouput}$) 78 is that the input optical intensity 66 (FIG. 4) is efficiently coupled back into an array of fibers with individual core diameter of approximately 22 µm and with a center-to-center spacing of approximately 176 µm. The shape of both the input and output envelope functions is determined by the cavity modal properties of the laser during operation. During laser operation, the resulting envelope function adjusts itself to pass into the spatial filter provided by the apertures 18 with a predetermined spatial distribution and the corresponding spacings disposed therebetween (in this case, the predetermined spatial distribution is the separation of distance D), with high transmission.

In order to achieve coupling back into the same fibers from which the energy exited, $D_1$ is set equal to $D_2$ (in this example approximately 209.8 µm). This enables utilization of the same optical fibers in both the image and the Fourier plane. Thus, the compact cavity will be designed in the "folded" configuration in the half-f (f/2) design, as shown in FIG. 1A.

This architecture is designed to be directly scalable to higher numbers of fiber lasers to generate kW-level diffraction-limited output power. In fact, this design can increase power, efficiency, and stability as the number of laser elements in the system increases.

Figure 6A:
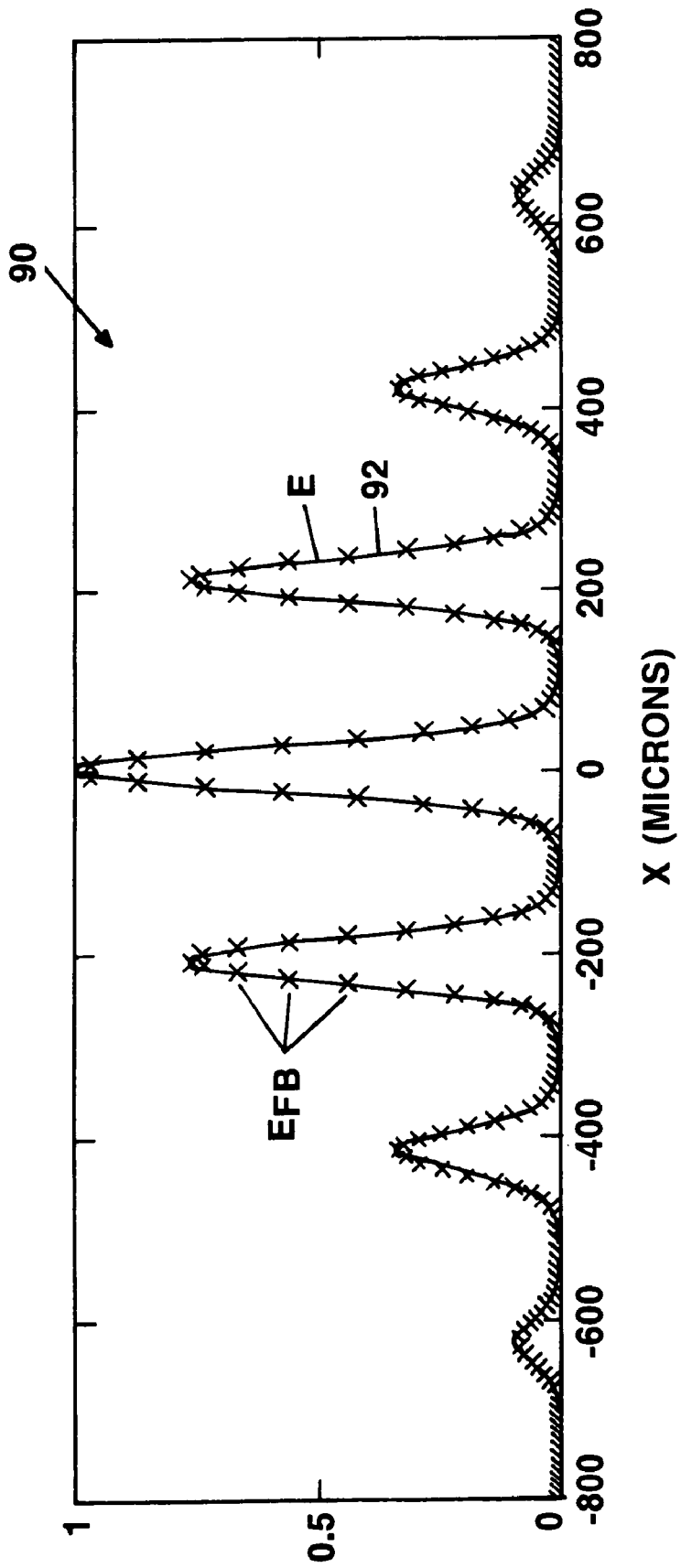
FIG. 6A is an exemplary radiation pattern showing the spatial distribution of the electric field amplitude pattern for both the emission from the lasers and the feedback to the lasers of a first level self Fourier function ($SFF_1$)

Referring now to FIG. 6A, a graph 90 has a horizontal scale in units of distance in microns and a vertical sale in relative unit, zero to one. The graph 90 is a one-dimensional graph of an electric field amplitude that could be emitted from a linear array of laser elements includes a curve 92 also labeled E. The Fourier transform of this pattern is presented as crosses, $E_{FB}$, of which only three are labeled for clarity. In this case, the spacings of the elements, $D_1$, $D_2$ (e.g., FIG. 2) are chosen such that $D_2 = D_1 = D = 209.8$ µm. This choice of D can yield a self Fourier function (SFF) 92. As can be seen, there is a high correlation between the emitted electric field amplitude, E, and the Fourier transform, $E_{FB}$, of this electric field (i.e., feedback to the array).

As described above, the optical intensity is equal to the magnitude of the electric field amplitude squared.

Figure 7:
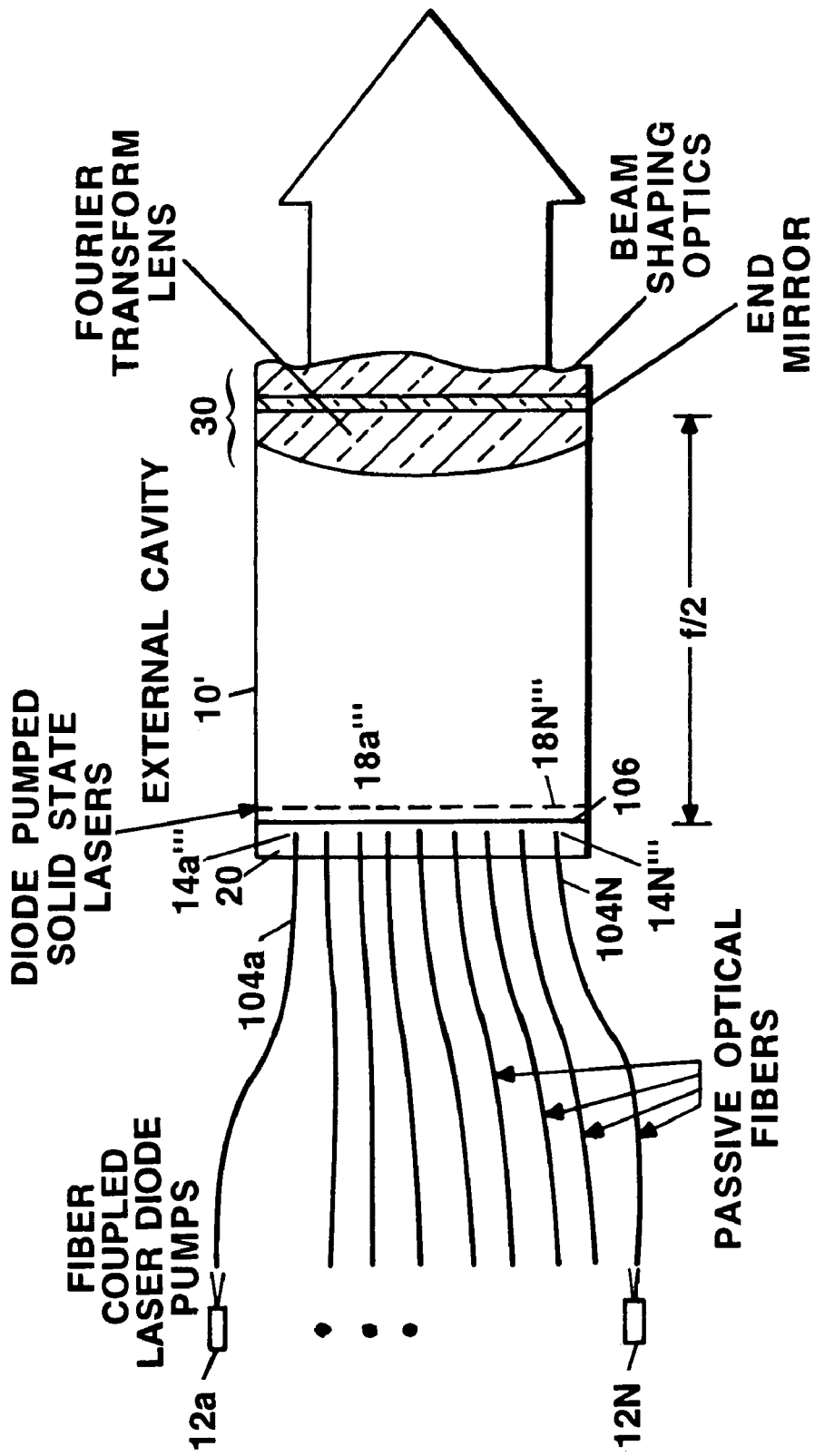
FIG. 7 is a schematic diagram of an of a compact phase locked laser array system including solid state lasers as the gain media according to another embodiment of the invention.

Now referring to FIG. 7, another embodiment of an assembly 10' includes a common element 30 and gain media 18a'''- 18N''' (generally referred to as gain media 18'''), here for example, solid state lasers. The gain media are coupled to conduits 104a-104N, here passive optical fibers. The conduits 104a-104N (generally referred to as passive optical fibers 104) are coupled to a corresponding one of a plurality of electromagnetic gain media energy sources 12a-12N, here for example, pump diodes. Each one of the gain media 18a'''- 18N''' includes a corresponding one of a plurality of apertures 14a'''-14N''' (generally referred to as apertures 14'''). The apertures 14''' are each spaced apart from a neighboring aperture 14''' in a predetermined spatial distribution having separation distances D to provide a spatial filter to establish a composite beam and radiation feedback to the gain media 18''' in order to provide phase coherency in the output beam. The assembly 10' further includes a single "front end" cavity mirror 106 disposed on the first end 20 of the assembly 10'. Optionally, polarization controllers (not shown) can be incorporated into a coupling mechanism (not shown) at the apertures 18''' to ensure the appropriate interference among the radiation in the cavity. Optical path length controllers (not shown) are optionally incorporated into the coupling mechanism to ensure the appropriate boundary conditions for the radiation in the separate portions of the cavity.

In operation, the gain media 18''', solid state lasers in this embodiment of the laser array system 100 are pumped with fiber-coupled spatially removed laser diodes pump energy sources 12. The single "front end" cavity mirror 106 is used as a reflector. The single reflector 106 is high reflective (HR) coated at the appropriate lasing wavelength ($\lambda_{solid\ state}$) and anti-reflective (AR) coated at the pumping wavelength. The gain media 18''' are preferably solid state Nd:YAG lasers, Ruby lasers, Nd:YLF lasers, or Ho:YAG lasers. It will be appreciated by those of ordinary skill in the art that other solid state lasers can be used as the gain media 18'''. The end mirror at the output of the cavity is partially reflective to allow some output from the cavity as well as to provide feedback to the array.

Figure 8:
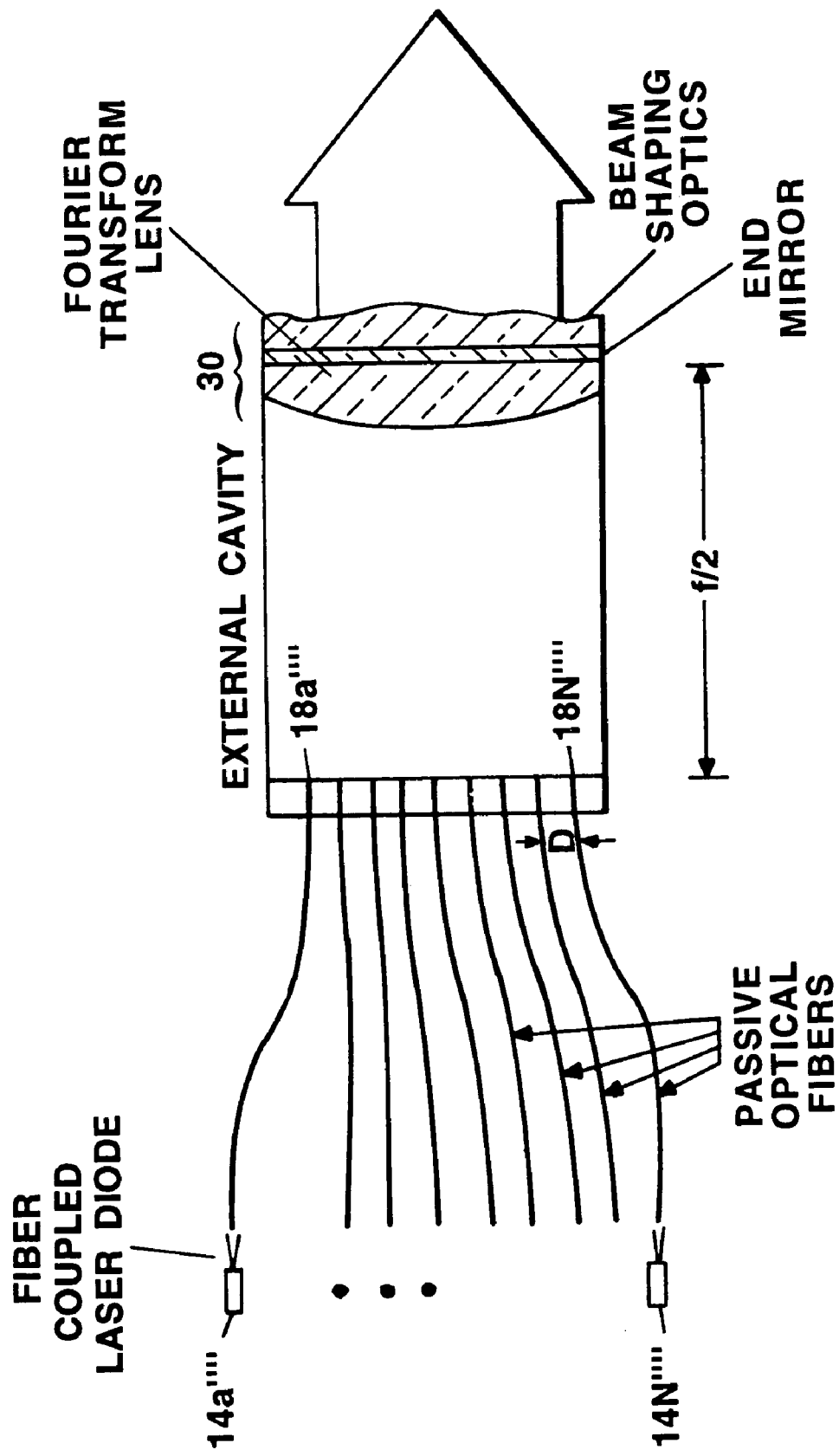
FIG. 8 is a schematic diagram of a compact phase locked laser array system including laser diodes coupled to the cavity using passive optical fibers, the laser diodes providing the gain media, according to still another embodiment of the invention.

Now referring to FIG. 8, in a third embodiment of an assembly 10 includes a common element 30 and a plurality of gain media 14a''''-14N'''', here spatially removed laser diodes (generally referred to as gain media 14'''') coupled to conduits 104a-104N (generally referred to as conduits 104). It will be appreciated by those of ordinary skill in the art that the apertures 18'''' of the gain media 14'''' need not be physically at the gain media (as in FIG. 1A) but may be remote from the gain media 14'''' and connected to the gain media through the conduits 104a-104N, here passive optical fibers. In operation, the gain media 14'''' are preferably antireflection coated on the facets adjacent to the conduits 104 and operate in conjunction with the conduits 104. In this embodiment of the laser array system 100, the conduits 104 provide a corresponding one of a plurality of apertures 18a''''-18N'''' (generally referred to as apertures 18'''') for the gain media 14''''. The apertures 18'''' are each spaced apart from a neighboring apertures 18'''' in a predetermined spatial distribution having a separation D. As described above, the predetermined spatial distribution of the apertures 18'''' and the corresponding spacings disposed therebetween provides the spatial filter to establish the composite beam and radiation feedback to the gain media 14'''' in order to provide phase coherency in the output.

A fourth embodiment is a variation of the system shown in FIG. 8 and includes the use of monolithic laser arrays as the gain media. In this case, each laser stripe (not shown) within the monolithic device (or set of monolithic devices) is regarded as the independent gain element.

Figure 9:
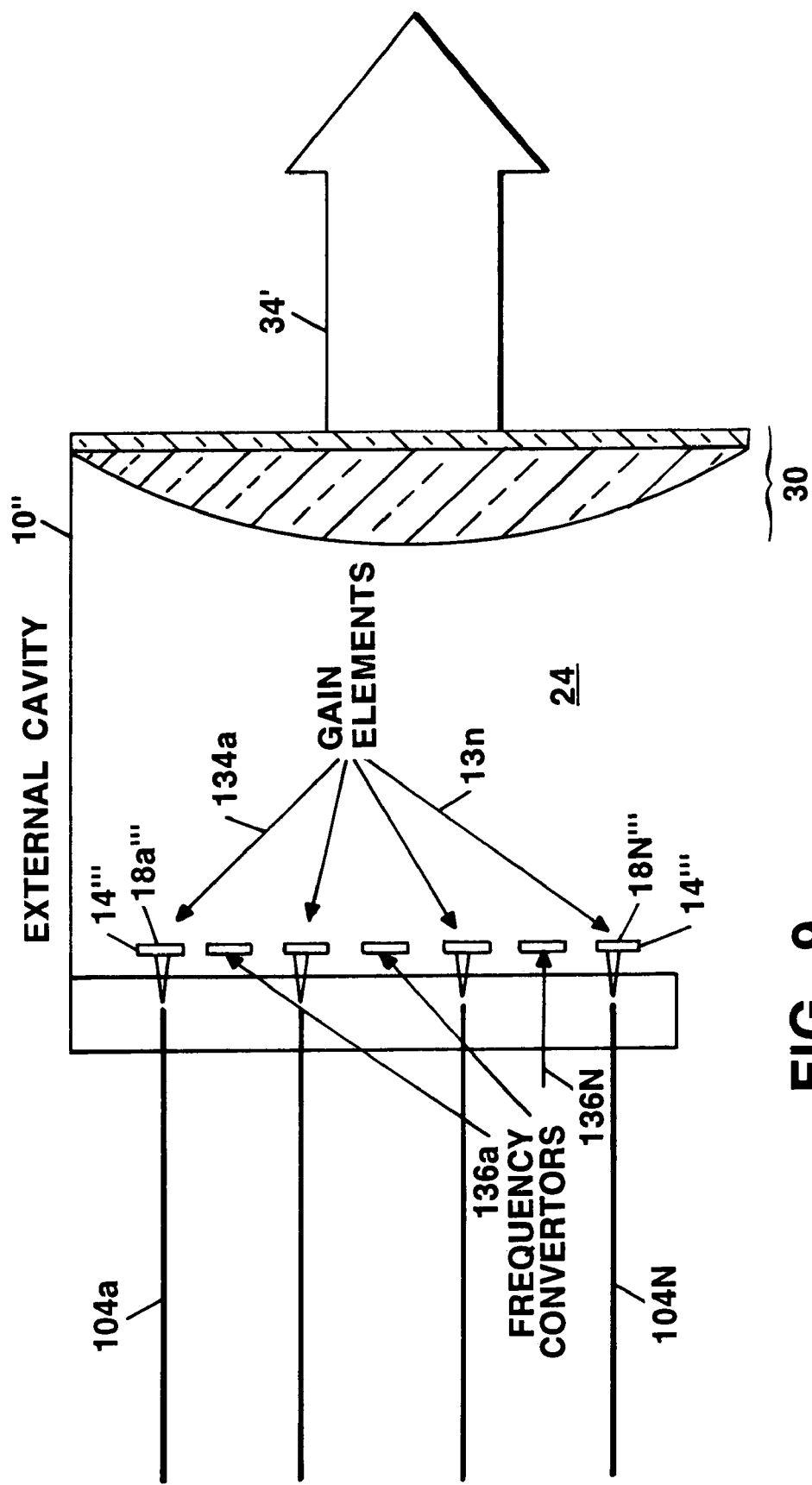
FIG. 9 is a schematic diagram of a compact phase locked laser array system including a plurality of frequency conversion devices offset from the plurality of gain media according to yet another embodiment of the invention

Now referring to FIG. 9, a fifth embodiment of an assembly 10'' includes a common element 30, a plurality of gain media 14''', here solid state lasers, having apertures 18''' thereof. Although shown using the solid state laser configuration of FIG. 7, it will be appreciated by those of ordinary skill in the art that other devices can operate as the gain media either located within the external cavity 24 or remote from the external cavity 24 and coupled by a conduit 104 (FIG. 7). The assembly 10'' further includes a plurality of frequency conversion devices 136a-136N (generally referred to as frequency conversion devices 136) spatially offset from the gain media 14'''. The spatial distribution of the apertures 18''' and the frequency conversion devices 136 is predetermined such that the energy being distributed about the plurality of apertures 18''' of the gain media 14''' is initially directed to the frequency conversion devices 136.

In operation, the frequency conversion devices 136 are disposed to receive portions of the radiation from the gain media 14''' after it is directed back by the common element 30 in this embodiment of the laser array system 100. For example, this is accomplished by adjusting the spacing $D_1$ (FIG. 2) and $D_2$ (FIG. 2) so that every other peak in the returned radiation is incident upon the frequency conversion device and every other peak is incident upon the gain media 14. In other words, we set $D_2=D_1/2$, while maintaining the original equation $D_1*D_2=F\cdot\lambda$. The output field is directed by the frequency conversion device 136 towards the common element 30 and back into the gain media in order to produce an output beam 34' with altered frequency characteristics but retaining phase coherency. The frequency conversion devices 136 can, for example, be frequency doubling crystals or other devices such as acoustic modulators, or polarization rotators. It will be appreciated by those of ordinary skill in the art, that the direction of the energy into the frequency conversion devices 136 can be accomplished by several different methods possibly using additional optical elements (not shown).

Figure 10:
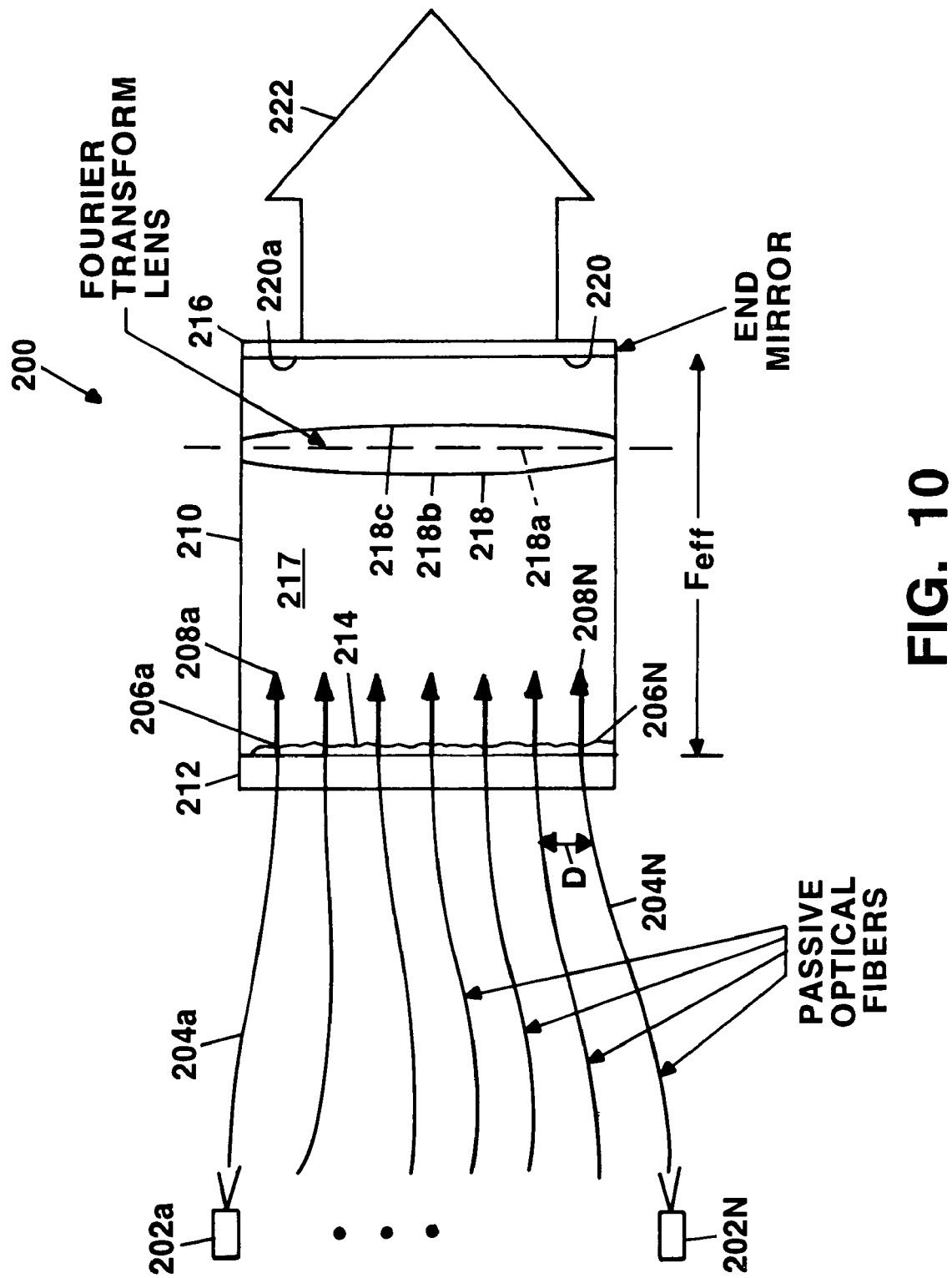
FIG. 10 is a schematic diagram of a compact phase locked laser array electro-optical system having a lens spaced apart from an end mirror.

Referring now to FIG. 10, another embodiment of an electro-optical system, here a laser array system 200 includes an assembly 210 having a housing 216 with a first end 212. The housing 216 can otherwise be referred to as an external cavity 217. An absorbing surface 214 is disposed on the first end 212. The assembly 210 also includes a lens 218 and a reflector 220. The lens 218 has a principal plane 218a and two refracting surfaces 218b, 218c. The reflector 220 has a partially reflecting surface 220a. The laser array system 200 further includes a plurality of conduits 204a-204N (generally referred to as passive optical fibers 204). The passive optical fibers 204 are disposed in a corresponding plurality of slots arranged on the first end 212 of the assembly 210.

Each one of the passive optical fibers 204 is electromagnetically coupled to a corresponding one of a plurality of electromagnetic gain media 202a-202N (generally referred to as gain media 202), for example, laser diodes. Each one of the passive optical fibers 204 includes a corresponding one of a plurality of ports or apertures 206a-206N (generally referred to as apertures 206). In operation, the gain media 202 provide laser energy via the passive optical fibers 204 that is coupled to the external cavity 217 via the apertures 206 to thereby provide a plurality of radiation beams 208a-208N within the external cavity 217. The radiation beams 208a-208N are emitted from apertures 206a-206N as separate beams. The radiation beams 208a-208N are combined in parallel by the two refracting surfaces 218b, 218c and by the partially reflecting surface 220a into a single composite output beam 222. The output beam 222 is referred to as a single beam because the array emits the combined radiation as a coherent bundle.

The apertures 206 are each spaced apart from a neighboring apertures 206 in a predetermined spatial distribution having a separation D. Similar to other embodiments described above, in operation, the predetermined spatial distribution of the apertures 206 and the corresponding spacings disposed therebetween provides the spatial filter to establish a composite beam and radiation feedback to the passive optical fibers 204 in order to provide phase coherency in the output beam 222. Energy returned from the partially reflecting surface 220a and arriving back at the apertures 206 has a predetermined pattern that matches the predetermined distribution of the apertures 206.

The lens 218 has a focal length, f, with an effective focal length, $F_{eff}$, resulting from both the round trip path of the radiation and the spacing between the lens 218 and the reflector 220. The length of the external cavity 217 is set to substantially equal the effective focal length, $F_{eff}$. The focal length of the lens 218 and an operating wavelength, $\lambda$, can be selected in accordance with the relationships described above in conjunction with FIG. 1A where the spacing D is set according to the following equation to achieve the Self Fourier condition: $D=\sqrt{F\cdot\lambda}$ as presented previously in conjunction with FIG. 2.

While gain media 202, passive optical fibers 204, and apertures 206a-206N are shown to be arranged in a line, in one particular embodiment, the gain media 202, passive optical fibers 204, and apertures 206a-206N are arranged symmetrically on a plane, having the relative spacing, D, along a plurality of axes on the plane. For instance, in particular embodiments, these elements can be arranged in a rectilinear array or in a hexagonal array. It is also to be understood that with the elements arranged symmetrically in a plane in this two-dimensional configuration, the spacing between the elements along the x axis ($D_x$) and the spacing between the elements along the y axis ($D_y$) are not constrained to be identical.

In one particular embodiment, a relative amplitude of the radiation beams 208a-208N along at least one axis on a plane of the apertures 206a-206N is a Self Fourier Function. The Self Fourier Function is further described above in conjunction with FIG. 1A where the spacing D is set according to the equation to achieve the Self Fourier condition described in conjunction with FIG. 2.

It should be understood that, while FIG. 10 shows diode lasers as the gain media 202, in other embodiments, other types of lasers or gain media may be used. Furthermore, which passive fibers 204 are shown, energy from the gain media 202 can be coupled to the cavity 217 in other ways.

Figure 10A:
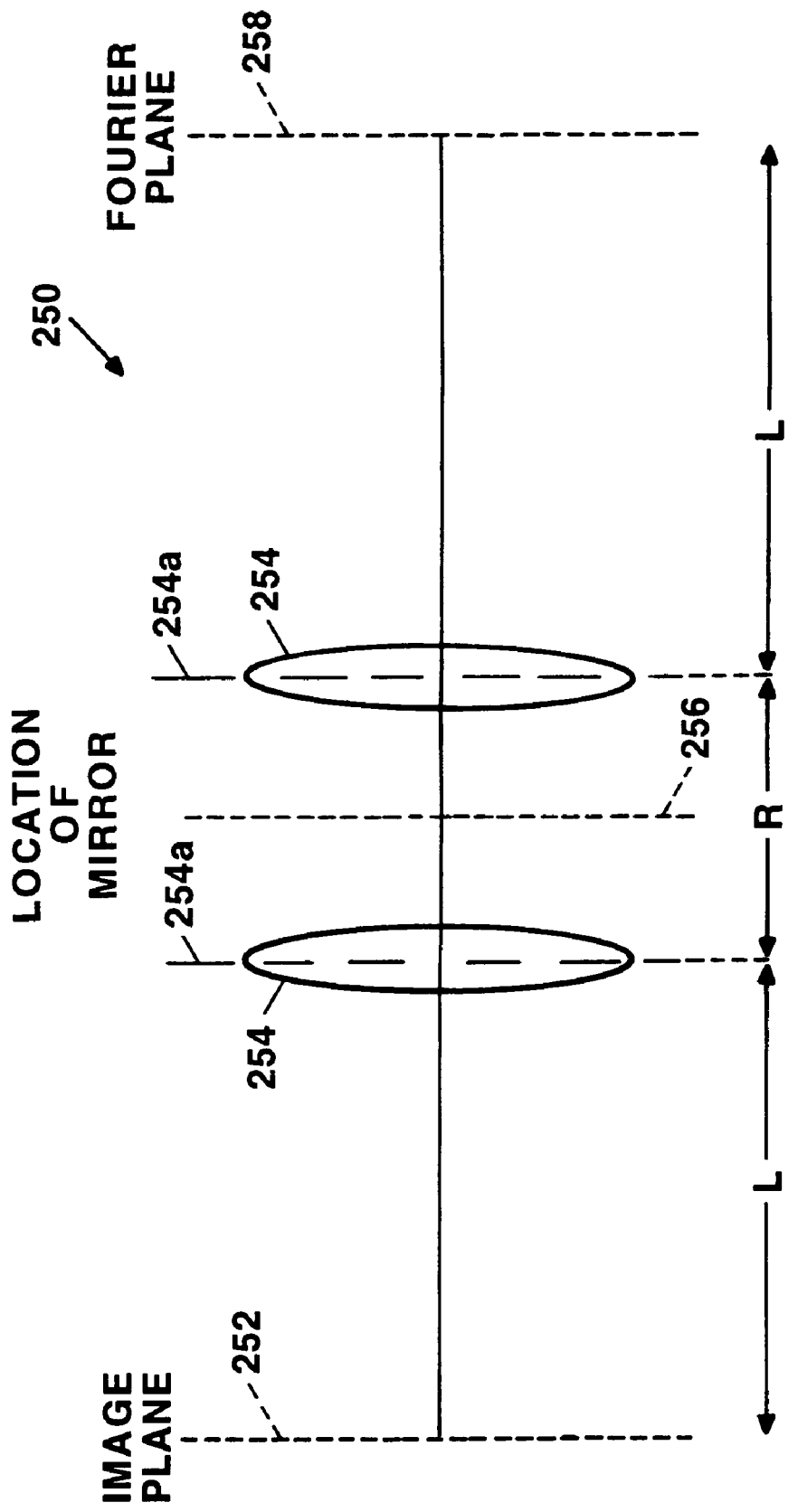
FIG. 10A is a pictorial showing a Fourier lens in relation to an image plane and a Fourier plane in an "unfolded" configuration.

Referring now to FIG. 10A, an image plane 252 is separated from a lens 254 having a principle plane 254a by a distance, L. The principle plane 254a is separated from a mirror 256 by a distance, R/2. The principle plane 254a is also separated from a Fourier Plane 258 by the distance, L, The lens 254 can be the same as or similar to the lens 218 of FIG. 10, the mirror 256 can be the same as or similar to the partially reflecting surface 220a of FIG. 10, and the image and Fourier planes 252, 258, respectively, can be the same as or similar to the plane of the apertures 206a-206N of FIG. 10.

In one particular embodiment, the distance, R/2, between the principal plane 254a and the mirror 256 is selected in accordance with the following equation. The spacing R can be chosen to achieve a desired effective focal length of the lens system with spacing. Here, R is the distance between the two lenses shown in FIG. 10A and thus R/2 is the spacing between the lens and the end mirror.

$$F_{eff} = f^2/(2*f-R)$$

where:

f=focal length of the lens; and $F_{eff}$=effective focal length (e.g., FIG. 10).

Figure 11:
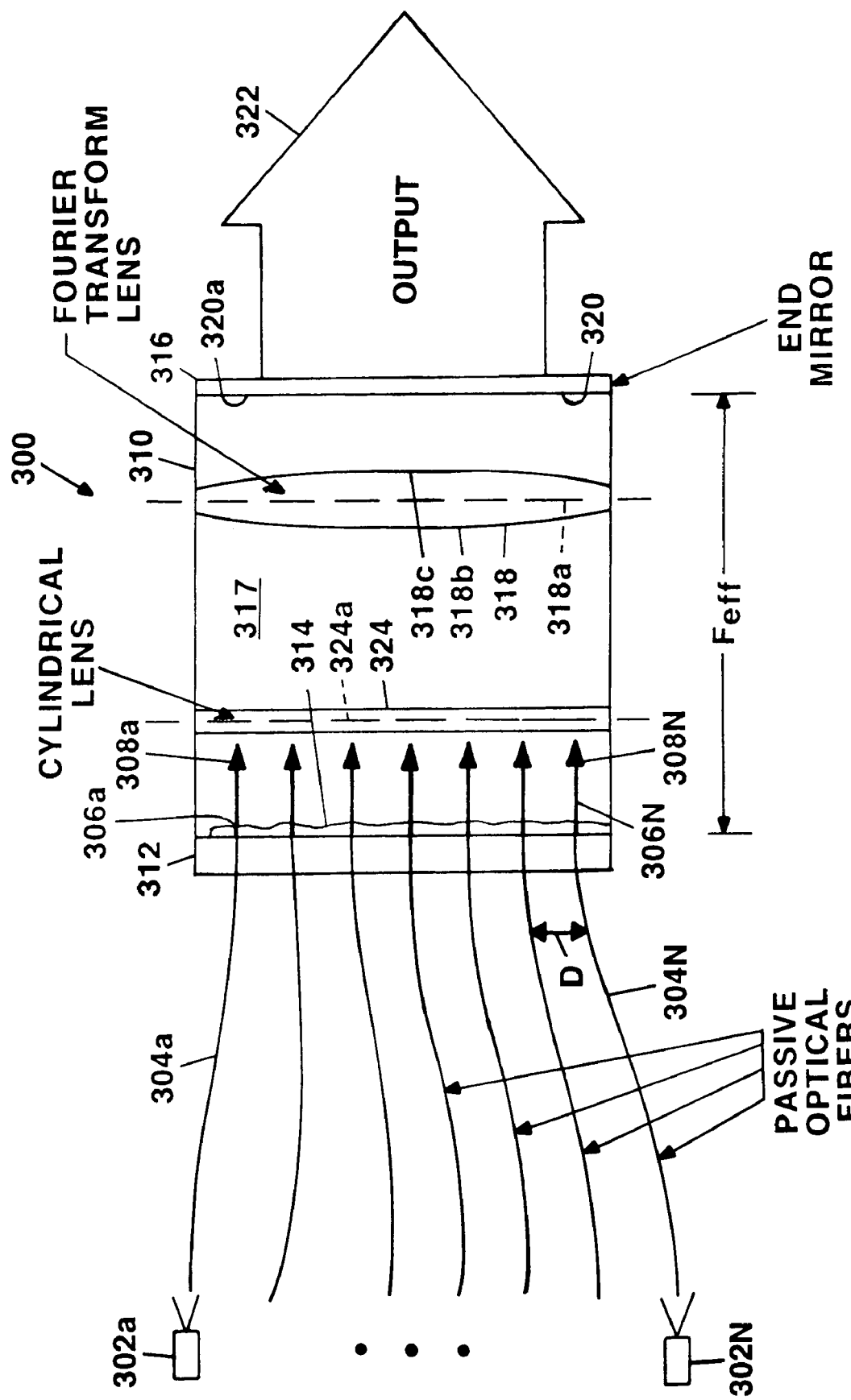
FIG. 11 is a schematic diagram of a compact phase locked laser array electro-optical system having a lens spaced apart from an end mirror and having a cylindrical lens.

Referring now to FIG. 11, another embodiment of an electro-optical system, here a laser array system 300, includes an assembly 310 having a housing 316 with a first end 312. The housing 316 has an external cavity 317, and can otherwise be referred to as an external cavity 317. An absorbing surface 314 is disposed on the first end 312. The assembly 310 also includes a lens 318, a cylindrical lens 324, and a reflector 320. The lens 318 has a principal plane 318a and two refracting surfaces 318b, 318c. The cylindrical lens 324 has a principal axis 324a. The reflector 320 has a partially reflecting surface 320a. The laser array system 300 further includes a plurality of conduits 304a-304N (generally referred to as passive optical fibers 304). Some of the passive optical fibers 304 are disposed on a corresponding plurality of slots arranged on the first end 312 of the assembly 310 along an axis parallel to the principal axis 324a of the cylindrical lens 324.

Each one of the passive optical fibers 304 is electromagnetically coupled to a corresponding one of a plurality of electromagnetic gain media energy sources 302a-302N (generally referred to as gain media 302), for example, laser diodes. Each one of the passive optical fibers 304 includes a corresponding one of a plurality of ports or apertures 306a-306N (generally referred to as apertures 306). In operation, the gain media 302 provide laser energy via the passive optical fibers 304 that is coupled to the external cavity 317 via the apertures 306 to thereby provide a plurality of radiation beams 308a-308N within the external cavity 317. The radiation beams 308a-308N are emitted from apertures 306a-306N as separate beams. The radiation beams 308a-308N are combined in parallel by the two refracting surfaces 318b, 318c and by the partially reflecting surface 320a into a single composite output beam 322. The output beam 322 is referred to as a single beam because the array emits the combined radiation as a coherent bundle.

The apertures 306 are each spaced apart from a neighboring apertures 306 in a predetermined spatial distribution having a separation D. Similar to other embodiments described above, in operation, the predetermined spatial distribution of the apertures 306 and the corresponding spacings disposed therebetween provides the spatial filter to establish a composite beam and radiation feedback to the gain media 304 in order to provide phase coherency in the output beam 322. Energy returned from the partially reflecting surface 320a and arriving back at the apertures 306 has a predetermined pattern that matches the predetermined distribution of the apertures 306.

The lens 318, in combination with the cylindrical lens 324, has a combined focal length selected to substantially focus the light emitted by the apertures 306 back onto and into the apertures 306 after a single round trip through the cavity 317. This results in the apertures 306 being imaged onto themselves (in a direction transverse to the array) after a single round trip through the cavity 317. The focal length of the lenses 318, 324 and the distance between the lenses 318, 324 can be determined by standard imaging equations for lenses.

While the gain media 302, the passive optical fibers 304, and the apertures 306a-306N are shown to be arranged in a line, in one particular embodiment, the gain media 302, the passive optical fibers 304, and the apertures 306a-306N are arranged symmetrically on a plane, having the relative spacing, D, along a plurality of axes on the plane.

Figure 12:
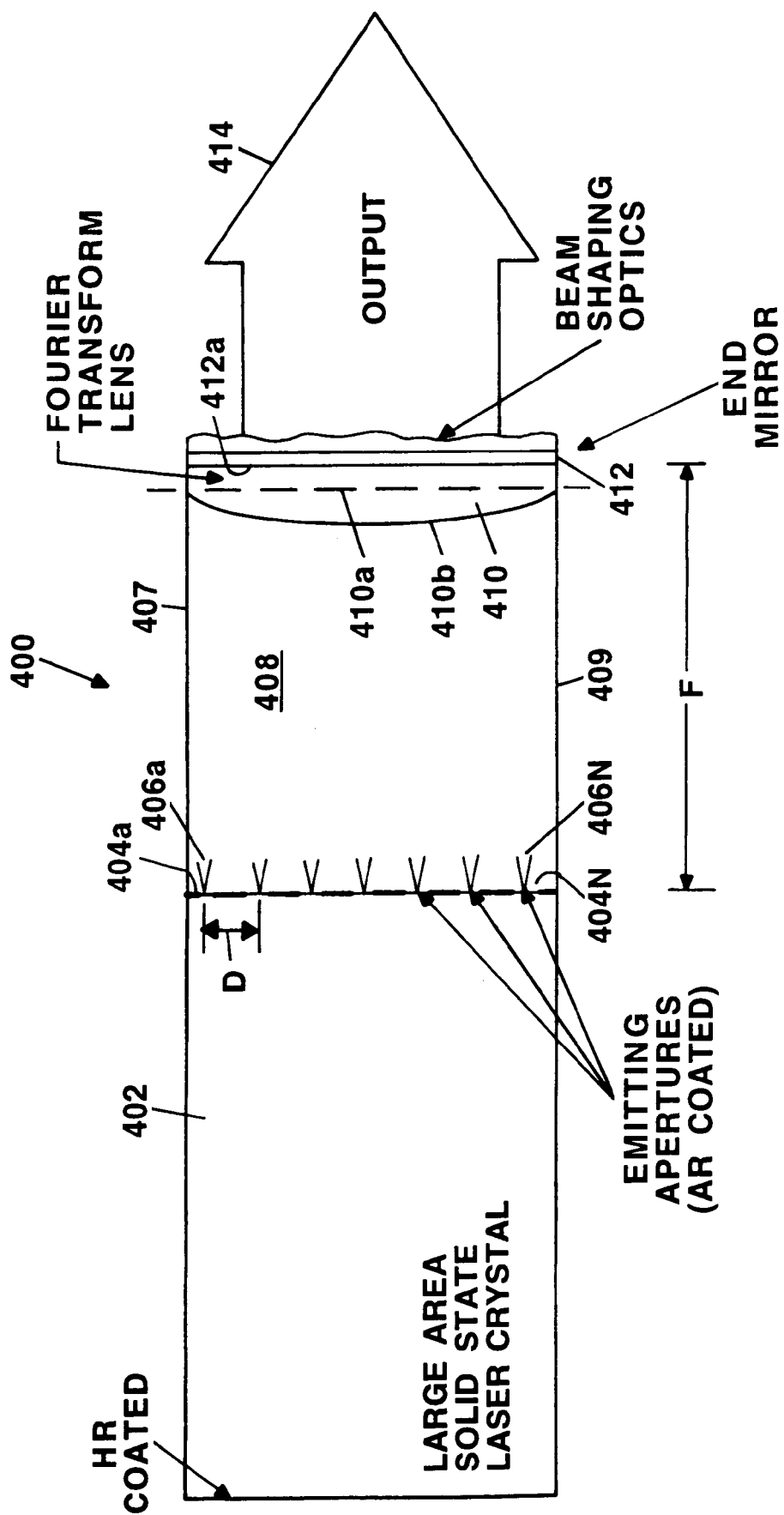
FIG. 12 is a schematic diagram of a compact phase locked laser array electro-optical system including a large area solid state laser.

In one particular embodiment, a relative amplitude of the radiation beams 308a-308N along at least one axis on a plane of the apertures 306a-306N is a self Fourier function. One example of such a self Fourier function is presented above in FIG. 6A Referring now to FIG. 12, another embodiment of an electro-optical system, here a laser array system 400 includes an assembly 407 having a housing 409. The housing 409 can otherwise be referred to as an external cavity 408. The assembly 407 also includes a lens 410 and a reflector 412. The lens 410 has a principal plane 410a and a refracting surface 410b. The reflector 412 has a partially reflecting surface 412a. The laser array system 400 further includes a large area solid state laser crystal 402.

The large area solid state laser crystal 402 is adjacent to a plurality of ports or apertures 404a-404N (generally referred to as apertures 404). The large area solid state laser crystal 402 provides electromagnetic energy that is coupled to the external cavity 408 via the apertures 404 to thereby provide a plurality of radiation beams 406a-406N within the external cavity 408. The radiation beams 406a-406N are emitted from apertures 404 as separate beams. The radiation beams 406a-406N are combined in parallel by the refracting surface 410b and by the partially reflecting surface 412a into a single composite output beam 414. The output beam 414 is referred to as a single beam because the array emits the combined radiation as a coherent bundle.

The apertures 404 are each spaced apart from a neighboring apertures 404 in a predetermined spatial distribution having a separation D. Similar to other embodiments described above, in operation, the predetermined spatial distribution of the apertures 404 and the corresponding spacings disposed therebetween provides the spatial filter to establish a composite beam and radiation feedback to the large area solid state laser crystal 402 in order to provide phase coherency in the output beam 414. Energy returned from the partially reflecting surface 410a and arriving back at the apertures 404 has a predetermined pattern that matches the predetermined distribution of the apertures 404.

While a line of apertures 404a-404N is shown, in one particular embodiment, the apertures 404 are arranged symmetrically on a plane, having the relative spacing, D, along a plurality of axes on the plane.

In one particular embodiment, a relative amplitude of the radiation beams 406a-406N along at least one axis on a plane of the apertures 404a-404N is a self Fourier function. The self Fourier function 92 is presented graphically in FIG. 6A above.

It should be appreciated that a different lens, for example the lens 218 of FIG. 10, and/or the lenses 318, 324 of FIG. 11 can be used in place of, or in addition to, the lens 410.

Figure 13:
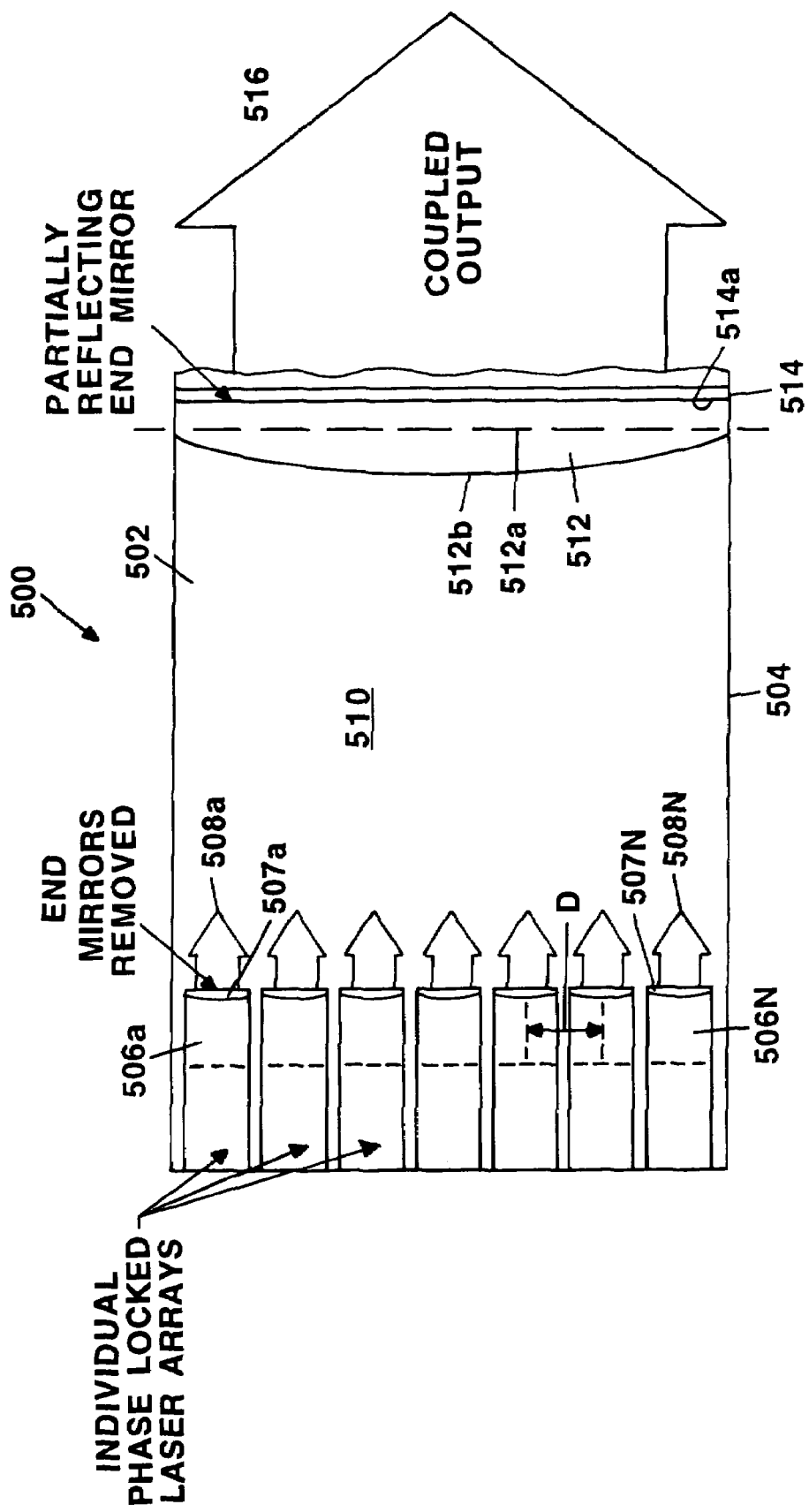
FIG. 13 is a schematic diagram of a compact phase locked laser array electro-optical system having electromagnetic gain media, each comprised of a respective compact phase locked laser array electro-optical system.

Referring now to FIG. 13, another embodiment of an electro-optical system, here a laser array system 500, includes an assembly 502 having a housing 504. The housing 504 has an external cavity 510, and can otherwise be referred to as an external cavity 510. The assembly 502 also includes a lens 512 and a reflector 514. The lens 512 has a principal plane 512a and a refracting surface 512b. The reflector 514 has a partially reflecting surface 514a. The laser array system 500 further includes a plurality of phase locked laser arrays 506a-506N (generally referred to as laser arrays 506). Each of the laser arrays 506 is formed as a laser array system, similar, for example to the laser array systems described in conjunction with FIGS. 1A, and 7-12.

The plurality of laser arrays 506 forms a respective plurality of ports or apertures 507a-507N (generally referred to as apertures 507). The plurality of laser arrays 506 provide electromagnetic energy that is coupled to the external cavity 510 via the apertures 507 to thereby provide a plurality of radiation beams 508a-508N within the external cavity 510. The radiation beams 508a-508N are emitted from apertures 507 as separate beams. The radiation beams 508a-508N are combined in parallel by the lens 512 having the refracting surface 512a and by the partially reflecting surface 514a into a single composite output beam 516. The output beam 516 is referred to as a single beam because the array 500 emits the combined radiation as a coherent bundle. Energy returned from the partially reflecting surface 514a and arriving back at the apertures 507 has a predetermined pattern that matches the predetermined distribution of the apertures 507.

The apertures 507 are each spaced apart from a neighboring apertures 507 in a predetermined spatial distribution having a separation, D. Similar to other embodiments described above, in operation, the predetermined spatial distribution of the apertures 507 and the corresponding spacings disposed therebetween provides the spatial filter to establish a composite beam and radiation feedback to the plurality of laser arrays 506 in order to provide phase coherency in the output beam 516.

It should be appreciated that a different lens, for example the lens 218 of FIG. 10, and/or the lenses 318, 324 of FIG. 11 can be used in place of, or in addition to, the lens 512. Each of the individual phase locked laser arrays 506 can have the form of the laser arrays shown, for example, in FIGS. 1A, and 7-12.

While a line of apertures 507a-507N is shown, in one particular embodiment, the apertures 507 are arranged symmetrically on a plane, having the relative spacing, D, along a plurality of axes on the plane.

In one particular embodiment, a relative amplitude of the radiation beams 508a-508N along at least one axis on a plane of the apertures 507a-507N is a self Fourier function. The self Fourier function 92 is presented graphically in FIG. 6A above.

Figure 14:
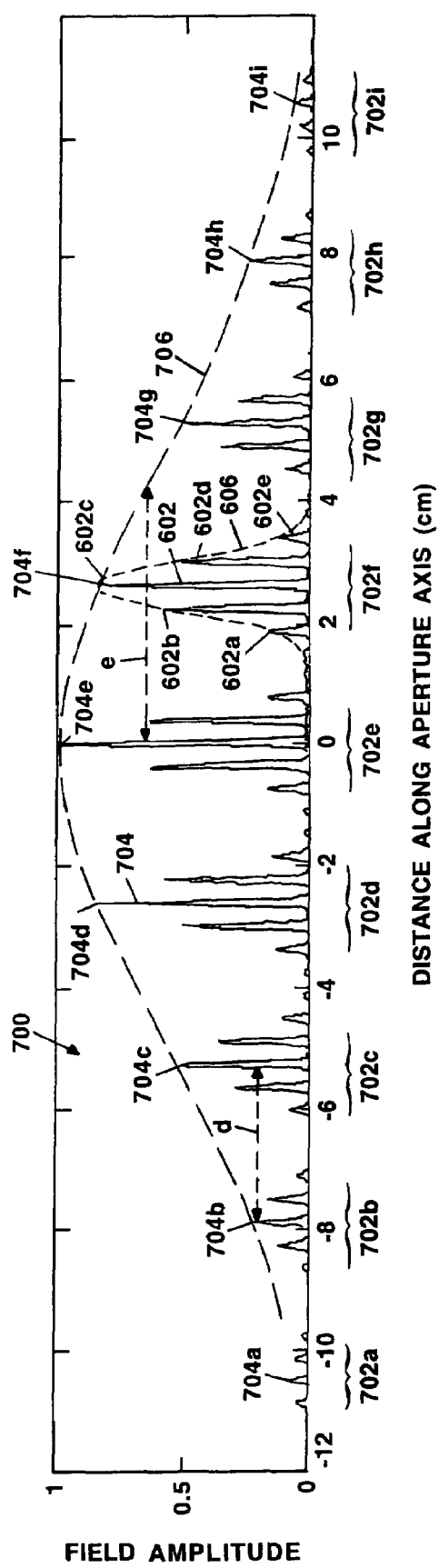
FIG. 14 is a graph showing a relationship between distance along an aperture axis and electromagnetic field amplitude for a second level self Fourier function ($SFF_2$)

Referring now to FIG. 14, a graph 700 includes a horizontal axis corresponding to distance along an axis of apertures, for example, along the apertures 206 of FIG. 10, in units of centimeters. A vertical axis corresponds to amplitude of the electric field in relative units.

Nine subgroups 702a-702i are shown, each having five spikes and corresponding peaks. Each of the nine subgroups 702a-702i also has a Gaussian envelope (not shown).

There are forty-five significant peaks, arranged in the nine subgroups 702a-702i. The forty-five peaks correspond to the weighted output amplitudes for a corresponding forty-five apertures along an aperture axis from any of the laser system embodiments shown, for example, in FIGS. 1 and 7-13. The forty-five spikes also correspond to feedback amplitude of energy returned to the apertures from the partially reflecting surface, for example, the partially reflecting surface 220a of FIG. 10.

The nine subgroups 702a-702i taken together form a curve 704 having all of the forty-five spikes. The nine subgroups 702a-702i have an envelope 706 having a shape that is generally Gaussian with a Gaussian width, e, at one standard deviation and passing through peaks 704a-704i of the curve 704. Adjacent ones of the subgroups 704a-704i have a spacing, d.

A curve 704 represents a self Fourier function, which can be referred to as a second level of the self Fourier function series ($SFF_2$). Using this nomenclature, the self Fourier function 92 presented in FIG. 6A can be referred to as a first level self Fourier function ($SFF_1$). In essence, the curve 704 can correspond to an intensity function provided by and received back to forty-five apertures in any of the laser system arrangement of FIGS. 1 and 7-13.

It will become apparent from discussion below, that in other embodiments, there can be more than 45 peaks or fewer than 45 peaks. This is achieved by changing the spacings between the laser elements and/or the widths of the apertures in the array.

Figure 15:
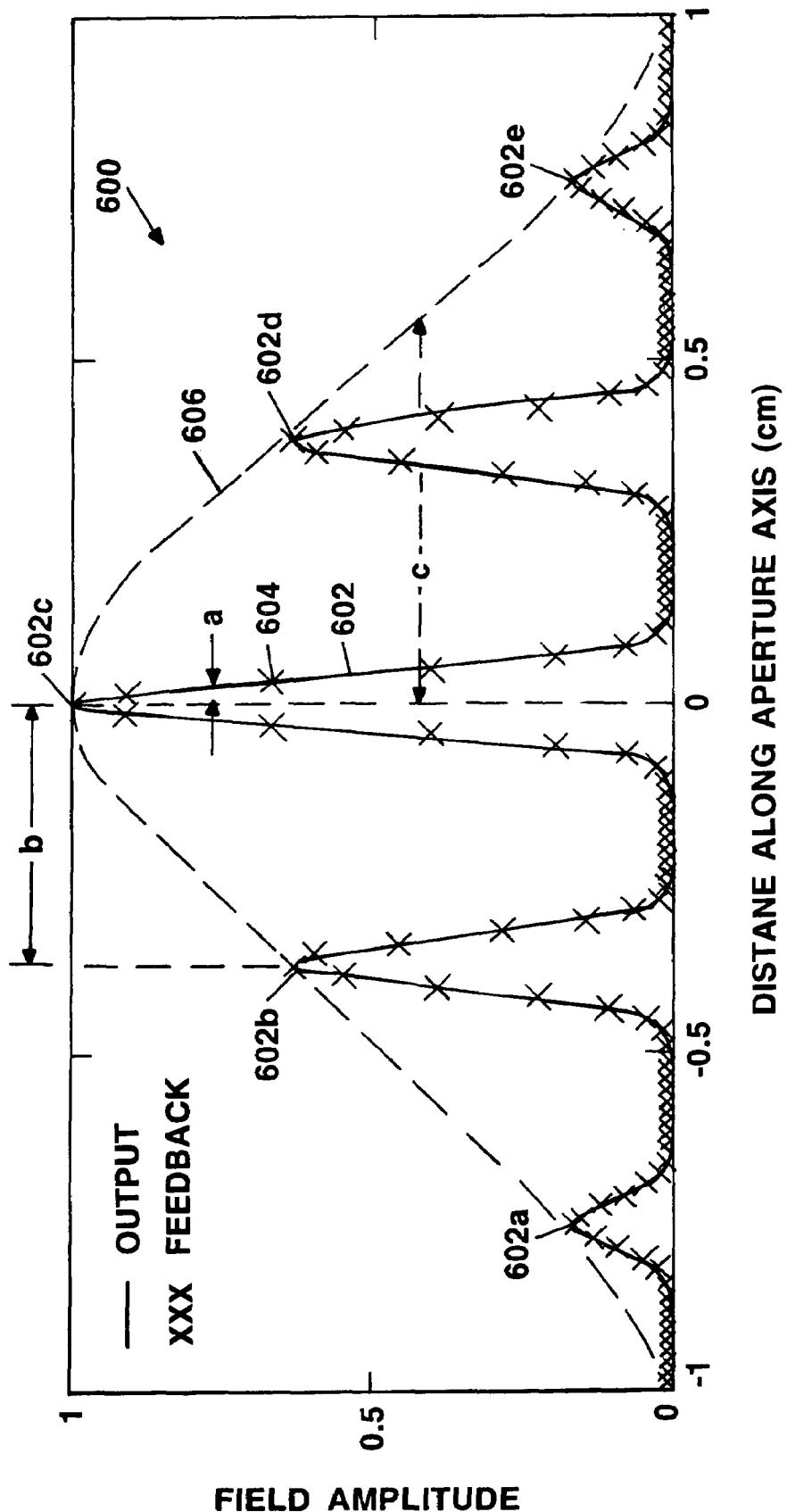
FIG. 15 is a is a graph showing a relationship between distance along an aperture axis and electromagnetic field amplitude for a central subgroup of a second level self Fourier function shown in FIG. 14.

Referring now to FIG. 15, a graph 600 includes a horizontal axis corresponding to distance along an axis of apertures, for example, along the apertures 206 of FIG. 10, in units of centimeters. A vertical axis corresponds to amplitude of the electric field in relative units.

A curve 602 corresponds to a close-up view of a central subgroup 702e (center 5 peaks) of the curve 704 shown in FIG. 14. The curve 602 is presented separately in order to better visualize parameters a, b, and c, described more fully below.

The curve 602 has five peaks 602a-602e. Each of the peaks 602a-602e is associated with a respective amplitude feature, also referred to herein as a spike, having a generally Gaussian shape. The curve 602 corresponds to a weighted output amplitude from a corresponding five apertures similar to a laser arrangement such as is shown in FIGS. 1 and 7-13, for example, from five of the apertures 206 of FIG. 10. Points, of which point 604 is but one example, also lying on the curve 602, correspond to feedback energy received at the apertures upon a round trip from the apertures to the partially reflecting surface, for example, from the partially reflecting surface 220a (FIG. 10), and back to the apertures 206. It will be appreciated that the output amplitude and position from the apertures, represented by the curve 602, is substantially the same as the feedback (return) energy received back at the aperture axis, represented by the points 604.

A variable, a, is used to describe the Gaussian width of any one of the Gaussian shaped spikes having the peaks 602a-602e. A variable, b, is used to describe a spacing between the spikes having the peaks 602a-602e. An envelope 606 associated with the peaks 602a-602e has a generally Gaussian shape with a Gaussian width represented by a variable, c.

It should be appreciated that, while a first level Self-Fourier function ($SFF_1$) 92 is shown in FIG. 6A, and a second level Self-Fourier function ($SFF_2$) 704 is shown in FIG. 14, functions at further levels can also be provided which will also provide a self Fourier function. For example, it can be seen that the second level self Fourier function represented by the curve 704 is a combination of replicas (subgroups 702a-702i) similar to the first level self Fourier function represented by the curve 92 of FIG. 6A. In the same way, a third level self Fourier function ($SFF_3$, not shown) can be generated by taking a combination of replicas with a similar form to the second level self Fourier function represented by the curve 704. The third level self Fourier function also has a Gaussian outer envelope, i.e., a different amplitude for the different replicas of the second level self Fourier function, and an associated comb function (with spacing d) associated with spacing between subgroups.

The second level self Fourier function ($SFF_2$) represented by the curve 704 can be written as:

$$SFF_2 = E \cdot [D\hat{x}(C \cdot [B\hat{x}A])],$$

where:

A=Gaussian function of each individual spike (e.g., spikes having the peaks 602a-602e, each with Gaussian width, a)

B=Comb function associated with the first level spikes (e.g., spikes having the peaks 602a-602e with the spacing, b)

C=Gaussian function associated with the envelope of spikes (e.g., curve 606, having Gaussian width, c)

D=Second level comb function associated with subgroups (e.g., the subgroups 702a-702i, having separation, d)

E=Gaussian function associated with the subgroups (e.g., the curve 706 having Gaussian width, e)

$\hat{x}$=convolution operator

In order for the second level self Fourier function to be a self Fourier function, the parameters a to e, the effective focal length, F, of the Fourier lens, and the operating wavelength, $\lambda$, are selected in order to approximately fulfill the following relationships:

$$a = F\lambda/(\pi e)$$

$$b = F\lambda/(d)$$

$$c = \text{SQRT}(F\lambda/\lambda)$$

where a-e are described above,

A self Fourier function (SFF) at any level can be written in terms of the self Fourier function at a preceding level as:

$$SFF_{n+1} = (\text{Gaussian Comb})\hat{x}SFF_n$$

where:

$SFF_{n+1}$=(n+1)th level self Fourier function

Gaussian=outer envelope of (n+1)th level self Fourier function

Comb=Comb function associated with (n+1)th level $\hat{x}$=convolution operator $SFF_n$=nth level self Fourier function It is to be understood that the spacing and widths of these Gaussians and combs are selected according to the pattern set up in the choice of parameters used in $SFF_2$.

While embodiments shown above include a partially reflecting surface, for example, the partially reflecting surface 220a of FIG. 10, disposed to reflect energy back toward apertures 206, in other embodiments, the partially reflecting surface can be a fully reflecting surface disposed to reflect energy back toward the apertures 206. In these embodiments, a partially reflecting surface (not shown), can be placed between the fully reflecting surface and the apertures to intercept the energy and direct a portion of the energy outward from the laser array system to provide an output beam.

While embodiments shown above include lenses in a variety of configurations having refractive characteristics, for example, the lens 218 of FIG. 10, in other embodiments, a lens can be used that has diffractive characteristics.

While particular lens and partially reflecting surface arrangements are described above, any combination of lenses and reflecting surfaces can be used that achieve a Fourier spatial transform of energy emitted by the apertures (resulting in a so-called "Fourier pattern") and that achieve an overlay, or a return, of the Fourier pattern back to at least some of the apertures. In still other embodiments, a combination of lenses and reflecting surfaces can be used that achieve more than one (for example, an odd number) Fourier spatial transform of energy emitted by the apertures (also resulting in a so-called "Fourier pattern") and that achieve an overlay, or a return, of the Fourier pattern back to at least some of the apertures.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. An electro-optical system, comprising:
   one or more electromagnetic gain media adapted to provide energy;
   a plurality of apertures coupled to the one or more electronic gain media, wherein said plurality of apertures has a predetermined spatial distribution, and wherein the plurality of apertures is adapted to emit the energy; and
   an optical system comprising:
      at least one refracting surface disposed to intercept the energy emitted from the plurality of apertures; and
      a reflecting surface disposed to direct at least a portion of the energy intercepted by the at least one refracting surface back toward the plurality of apertures,
   wherein the reflecting surface is disposed at a predetermined distance from the one or more apertures, wherein the one or more lenses, positions of the one or more lenses, and the predetermined distance are selected to result in a Fourier pattern of the energy emitted from the plurality of apertures, and to result in the Fourier pattern being overlaid back onto selected ones of the plurality of apertures, wherein the optical system is configured to reflect back to the plurality of apertures substantially the same pattern of energy that would be achieved when the at least one refracting surface is a single lens and when the single lens and the reflecting surface are both spaced from the plurality of apertures by approximately one half of a focal length of the lens.

2. The system of claim 1, wherein the at least one refracting surface comprises at least one of a first or a second refractive surfaces of a lens.

3. The system of claim 2, wherein a principal plane of the lens is spaced from the plurality of apertures and from the reflecting surface in accordance with one half focal length of the at least one refracting surface.

4. The system of claim 2, wherein the plurality of apertures is spaced from the reflecting surface in accordance with a focal length of the lens.

5. The system of claim 1, wherein the at least one refracting surface comprises a first surface of a lens, wherein a second surface of the lens is substantially flat and disposed proximate to the reflecting surface, and wherein a principal plane of the lens is spaced from the plurality of apertures by approximately one half a focal length of the at least one refracting surface.

6. The system of claim 1, wherein ones of the plurality of apertures are disposed generally along a line.

7. The system of claim 6, wherein the at least one refracting surface includes a cylindrical lens having a cylindrical refracting surface, the cylindrical lens disposed to intercept energy emitted from the plurality of apertures, wherein the cylindrical refracting surface of the cylindrical lens is provided having a respective shape selected such that the directed energy is distributed about the plurality of apertures in the predetermined pattern.

8. The system of claim 7, wherein the cylindrical surface, the at least one refracting surface, and the reflecting surface direct the energy emitted from each of the plurality of apertures substantially back over the plurality of apertures.

9. The system of claim 1, wherein only one spatial Fourier transform of a pattern of the intercepted energy is achieved upon a single round trip from an aperture to the reflecting surface and back from the reflecting surface to the aperture.

10. The system of claim 1, wherein an odd number of Fourier transforms of a pattern of the intercepted energy is achieved upon a single round trip from an aperture to the reflecting surface and back from the reflecting surface to the aperture.

11. The system of claim 1, wherein the at least one refracting surface causes a Fourier pattern of the energy emitted from the plurality of apertures to be overlaid back onto itself.

12. The system of claim 1, wherein the plurality of apertures has a corresponding Fourier plane and the Fourier plane is overlaid back onto the plurality of apertures by means of the at least one refracting surface and the reflecting surface.

13. The system of claim 1, wherein at least one spatial Fourier transform of a pattern of the intercepted energy is achieved upon a single round trip from an aperture to the reflecting surface and back from the reflecting surface to the aperture.

14. The system of claim 13, wherein the at least one Fourier transform of the pattern of the intercepted energy is overlaid on the plurality of apertures.

15. The system of claim 13, wherein the plurality of apertures has a predetermined spatial distribution such that a corresponding intercepted energy pattern has a plurality of intensity peaks at corresponding locations of the at least one Fourier transform of the pattern that is achieved through the action of a cavity.

16. The system of claim 1, wherein the at least one refracting surface comprises a first surface of a lens.

17. The system of claim 1, wherein the reflecting surface comprises a mirror.

18. The system of claim 1, wherein the at least one refracting surface is adjacent to the reflecting surface.

19. The system of claim 1, wherein the plurality of apertures include N apertures where N is greater than two.

20. The system of claim 19, wherein the reflecting surface directs portions of the intercepted energy toward each of the N apertures.

21. The system of claim 1, wherein the at least one refracting surface and the reflecting surface direct the energy emitted from each of the plurality of apertures substantially back over the plurality of apertures.

22. The system of claim 1, wherein the energy directed by the reflecting surface has, at a plane defined by the plurality of apertures, a spatial pattern corresponding to a Fourier transform of an input energy spatial pattern of the energy emitted from the plurality of apertures.

23. The system of claim 1, wherein the one or more electromagnetic gain media comprises a large area laser and more thin one of the plurality of apertures are associated with the large area laser.

24. The system of claim 1, wherein the one or more electromagnetic gain media comprises a large area laser and each one of the plurality of apertures is associated with the large area laser.

25. The system of claim 1, wherein the one or more electromagnetic gain media comprises a plurality of laser arrays, each laser array providing one of the plurality of apertures, each laser array comprising:
  another one or more electromagnetic gain media adapted to provide the energy;
  another plurality of apertures coupled to the another one or more electromagnetic gain media, wherein the another plurality of apertures has another predetermined spatial distribution, and wherein the another plurality of apertures are adapted to emit the energy; and
  another optical system adapted to provide a Fourier pattern of the energy emitted from the another plurality of apertures and adapted to overlay the Fourier pattern back onto selected ones of the another plurality of apertures.

26. The system claim 1, wherein the one or more electromagnetic gain media comprise at least one of:
  a diode pumped fiber laser,
  a diode laser,
  a fiber coupled diode laser,
  a gas laser,
  a dye laser,
  a diode pumped solid state laser, or
  a monolithic laser diode array.

27. The system of claim 26, wherein the diode pumped solid state laser comprises at least one of:
  an Nd:YAG laser,
  a Ruby laser,
  an Nd:YLF laser, or
  an Ho:YAG laser.

28. The system of claim 1, wherein the plurality of apertures is disposed to increase the amount of energy directed into each one of the plurality of apertures.

29. The system of claim 1, further included a plurality of frequency conversion devices disposed generally in a plane of the plurality of apertures, wherein the predetermined spatial distribution of the plurality of apertures is selected such that the energy emitted by the plurality of apertures intercepts the plurality of frequency conversion devices.

30. The system of claim 29, wherein the frequency conversion devices are frequency doubling crystals.

31. The system of claim 1, wherein the energy emitted from the plurality of apertures corresponds to a self Fourier function.

32. The system of claim 1, wherein regions of constructive interference are disposed on the apertures to produce an output of the system as a composite beam comprised of energy having phase coherency from the one or more electromagnetic gain media.

33. The system of claim 1, wherein the predetermined spatial distribution of the plurality of apertures provides a spatial Fourier filter, which combines in parallel the energy from each of the one or more electromagnetic gain media.

34. The system of claim 1, wherein the plurality of apertures is located in a corresponding Fourier plane.

35. The system of claim 1, wherein the plurality of apertures is disposed such that an interference pattern of energy emitted from the plurality of apertures has a plurality of spots at substantially the same position as the plurality of apertures has a plurality of spots at substantially the same position as the plurality of apertures.

36. The system of claim 1, wherein the predetermined spatial distribution provides a spatial Fourier filter establishing a composite beam comprised of energy having phase coherency from the one or more electromagnetic gain media.

37. The system of claim 1, wherein the plurality of apertures has a corresponding Fourier plane and the apertures are disposed in the Fourier plane.

38. The system of claim 1, wherein the plurality of apertures is arranged such that a Fourier pattern of the energy emitted from the plurality of apertures is coupled back into the plurality of apertures.

39. A method of producing a phase coherent beam comprising:
   providing one or more electromagnetic gain media adapted to provide energy;
   providing a plurality of apertures coupled to the one or more electronic gain media, wherein the plurality of apertures has a predetermined spatial distribution;
   emitting the energy from the plurality of apertures;
   generating a Fourier pattern of the energy emitted from the plurality of apertures; and
   overlaying the Fourier pattern back onto selected ones of the plurality of apertures, wherein the generating and the overlapping are provided by an optical system, comprising:
      at least one refracting surface disposed to intercept the energy; and
      a reflecting surface disposed to reflect at least a portion of the intercepted energy back toward the plurality of apertures,
   wherein the optical system is confirmed to reflect back to the plurality of apertures substantially the same pattern of energy that would be achieved when the at least one refracting surface is a single lens and the reflecting surface are both spaced from the plurality of apertures by approximately one half of a focal length of the lens.

40. The method of claim 39, wherein the predetermined spatial distribution is adapted to provide a spatial Fourier filter.

41. The method of claim 39, wherein the at least one refracting surface comprises first and second surfaces of a lens.

42. The method of claim 39, wherein the at least one refracting surface comprises first and second surfaces of a lens and a surface of a cylindrical lens.

43. The method of claim 39, wherein each of the at least one refracting surface has a respective shape selected such that energy returned from the reflecting surface is distribution about the plurality of apertures in a predetermined pattern.

44. The method of claim 39, wherein the one or more electromagnetic gain media comprises a larger area laser and more than one of the plurality of apertures are associated with the large area laser.

* * * * *